United States Patent
Tang et al.

(10) Patent No.: US 10,447,247 B1
(45) Date of Patent: Oct. 15, 2019

(54) DUTY CYCLE CORRECTION ON AN INTERVAL-BY-INTERVAL BASIS

(71) Applicant: SanDisk Technologies LLC, Plano, TX (US)

(72) Inventors: Tianyu Tang, Milpitas, CA (US); Venkatesh Ramachandra, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/965,099

(22) Filed: Apr. 27, 2018

(51) Int. Cl.
*H03K 3/017* (2006.01)
*G11C 7/22* (2006.01)

(52) U.S. Cl.
CPC ............. *H03K 3/017* (2013.01); *G11C 7/222* (2013.01)

(58) Field of Classification Search
CPC .................................. H03K 3/07; G11C 7/222
See application file for complete search history.

(56) References Cited

U.S. PATENT DOCUMENTS

| 6,664,838 | B1 * | 12/2003 | Talledo | G11C 7/22 327/277 |
| 8,040,070 | B2 * | 10/2011 | Myers | H05B 33/0815 315/209 R |
| 8,060,326 | B2 * | 11/2011 | Miyazaki | G01R 29/02 702/69 |
| 8,243,865 | B2 * | 8/2012 | Tsukamoto | H03M 7/3048 375/136 |
| 8,269,530 | B2 * | 9/2012 | Tao | H03K 5/00006 327/116 |
| 8,305,113 | B1 * | 11/2012 | Payne | H03K 5/003 327/72 |
| 8,736,329 | B1 * | 5/2014 | Rajavi | H03K 5/1565 327/172 |
| 8,779,819 | B1 * | 7/2014 | Venditti | H03K 5/086 327/170 |
| 9,219,470 | B1 * | 12/2015 | Venditti | H03K 5/1565 |
| 9,419,598 | B2 * | 8/2016 | Palmer | H03K 5/131 |
| 9,531,358 | B2 * | 12/2016 | Tseng | H03K 19/21 |
| 9,886,987 | B1 * | 2/2018 | Brahmadathan | G11C 7/1072 |
| 9,985,618 | B2 * | 5/2018 | Park | H03K 5/1565 |
| 9,991,075 | B2 * | 6/2018 | Lenig | H01H 9/56 |
| 2003/0111705 | A1 | 6/2003 | Seo | |
| 2010/0295591 | A1 * | 11/2010 | Asmanis | H04L 25/03878 327/276 |
| 2013/0076395 | A1 | 3/2013 | Kim | |
| 2014/0125391 | A1 * | 5/2014 | Seon | H03K 5/1565 327/175 |

* cited by examiner

*Primary Examiner* — Thomas J. Hiltunen
(74) *Attorney, Agent, or Firm* — Foley & Lardner LLP

(57) ABSTRACT

A duty cycle correction system corrects for duty cycle distortion by measuring average time interval durations of consecutive intervals of an input signal. The system generates complementary ramp signals that have cross-points indicating midpoints of the intervals, and detects those cross-points. An output circuit of the duty cycle correction system generates an output signal that performs rising and falling transitions in response to the detected cross-points.

22 Claims, 9 Drawing Sheets

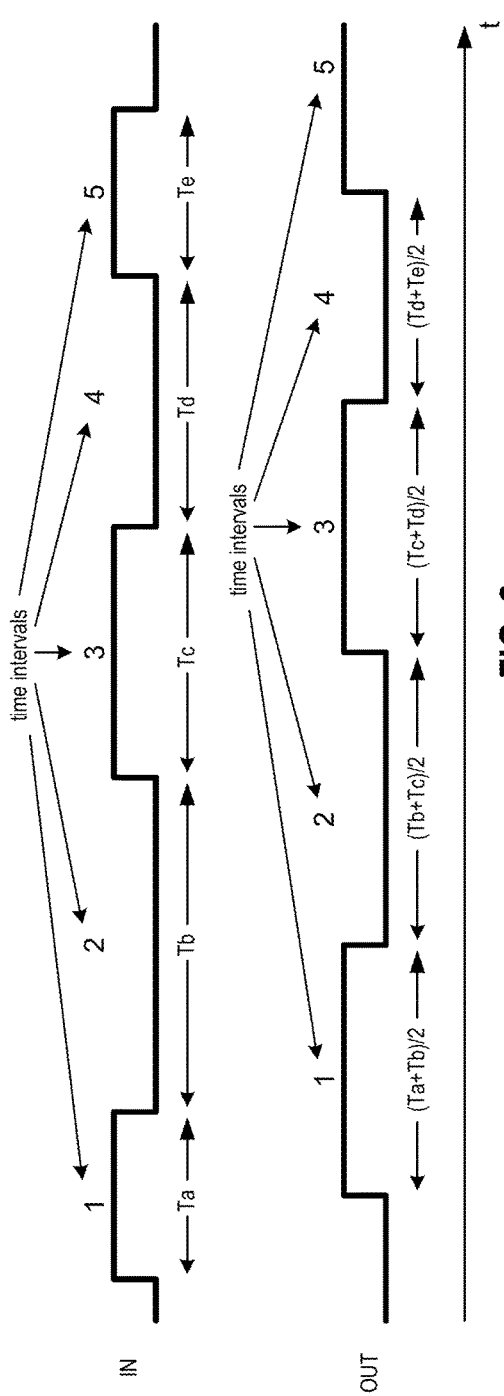
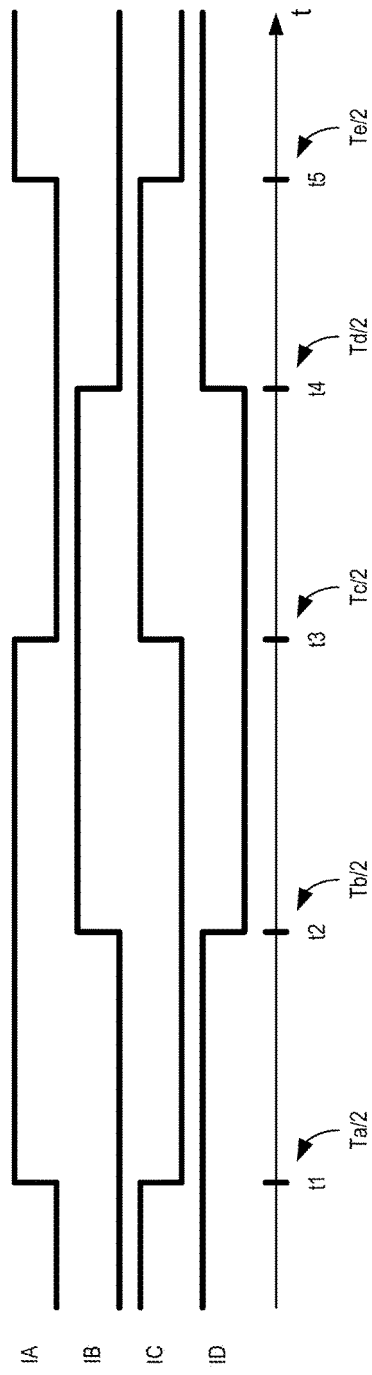
FIG. 2
FIG. 3

DUTY CYCLE CORRECTION ON AN INTERVAL-BY-INTERVAL BASIS

BACKGROUND

In memory applications, a storage device may include a controller that sends a complementary pair of clock signals to a memory die in order to read data from the memory die and/or write data to the memory die. For read operations, in response to the clock signals, the memory die may align data pulses of data signals to the edges of the clock signals and send the aligned data signals along with clocks signals back to the controller. The controller may then process the data signals using the clock signals. For write operations, in response to the clock signals, the memory die may sample voltage levels of data pulses of data signals carrying data that the controller wants programmed into memory cells of the memory die.

Typically, the clocks signals have a 50% duty cycle. In an ideal situation, the controller generates the clock signals with the 50% duty cycle, and the duty cycle remains at 50% throughout the read process. That is, the memory die retrieving the data for the controller receives the clock signals with the 50% duty cycle, maintains the duty cycle at 50% while aligning the data, and transmits the clocks signals with a 50% duty cycle back to the controller.

However, in actual implementation, due to process-voltage-temperature (PVT) variations and silicon interface impact between the controller and the memory die, the controller and the memory die may not receive clock signals with a 50% duty cycle, leading to sampling errors. As such, ways to implement duty cycle correction schemes that move the duty cycle closer to 50% are desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 2 is a timing diagram of an example input signal with duty cycle distortion and an example output signal with time durations set to average time interval durations.

FIG. 3 is a timing diagram of a set of intermediate signals generated by a measurement circuit 102 of the duty cycle correction system.

DETAILED DESCRIPTION

Figure 1:
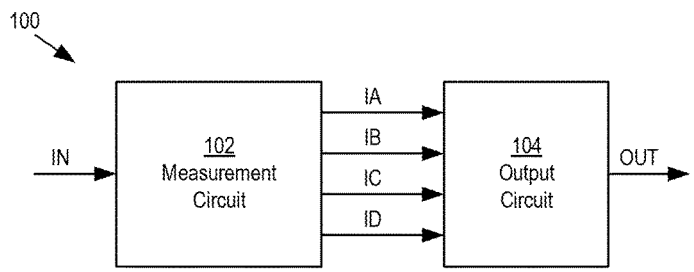
FIG. 1 is a block diagram of an example duty cycle correction system.

The following embodiments describe various apparatuses, devices, systems, circuits, and methods for performing duty cycle correction. In one embodiment, a circuit includes a measurement circuit and an output circuit. The measurement circuit is configured to: receive an input signal; and measure an average time interval duration of a pair of consecutive time intervals of the input signal. The output circuit is configured to generate an output signal comprising a time interval having a duration set to the average time interval duration.

In some embodiments, the measurement circuit includes a detection circuit configured to detect a first midpoint of a first time interval of the pair of consecutive time intervals, and detect a second midpoint of a second time interval following the first midpoint of the first time interval of the pair of consecutive time intervals in order to measure the average time interval duration.

In some embodiments, the measurement circuit includes: a ramp generation circuit and a detection circuit. The ramp generation circuit is configured to generate a first pair of complementary ramp signals that perform first transitions over a first ramp period corresponding to the first interval of the pair of consecutive time intervals, and generate second pair of complementary ramp signals that perform second transitions over a second time interval of the pair of consecutive time intervals. The detection circuit is configured to detect a first cross-point of the first transitions and a second cross-point of the second transitions in order to measure the average time interval duration.

In some embodiments, the measurement circuit includes a frequency division circuit configured to generate a first signal based on rising edges of the input signal and a second signal based on falling edges of the input signal. In addition, the ramp generation circuit includes: a push-pull circuit configured to generate one of the first pair of complementary ramp signals, a delay chain configured to generate a plurality of delay signals based on the first signal, and a drive strength controller configured to continuously increase a drive strength of the push-pull circuit based on a subset of delay signals of the plurality of delay signals that transition in a time window set by the first signal and the second signal.

In some embodiments, the push-pull circuit comprises a first push-pull circuit, the drive strength comprising a first drive strength, and the ramp generation circuit comprising a second push-pull circuit configured to generate the other of the first pair of complementary ramp signals. The drive strength controller is further configured to continuously increase a drive strength of the second push-pull circuit based on the subset of delay signals of the plurality of delay signals that transition in the time window.

In some embodiments, the drive strength controller includes a drive strength control signal generator configured to receive a delay signal of the subset of delay signals transitioning in the time window, and transition a level of a drive strength control signal in response to transitioning the delay signal in order to increase the drive strength of the push-pull circuit.

In some embodiments, the drive strength control signal generator includes: a first signal sub-generator configured to generate a first internal control signal to control one of a pull-up drive strength or a push-down drive strength of the push-pull circuit, and a second signal sub-generator configured to generate a second internal control signal to control the other of the pull-up drive strength or the push-down drive strength of the push-pull circuit.

In some embodiments, the ramp generation circuit further includes: an XNOR gate configured perform an XNOR logic operation on the first signal and the second signal to generate an XNOR signal, and an AND gate configured to perform an AND logic operation on the first signal and the second signal to generate an AND signal. Also, the first signal sub-generator includes: a dual edge flip flop configured to receive the delay signal and the XNOR signal, and a first NAND gate configured to perform a NAND logic operation on an output of the dual-edge flip and the second signal to generate the first internal control signal. The second signal sub-generator includes: a second NAND gate configured to perform a NAND operation on the first signal and the delay signal, and an OR gate configured to perform an OR operation on an output of the second NAND gate and the AND signal to generate the second internal control signal.

In some embodiments, the drive strength controller includes a plurality of drive strength signal generators configured to output a plurality of signals to control the drive strength of the push-pull circuit, where each drive strength signal generator is configured to: receive a respective one of the plurality of delay signals, and output a respective one of the plurality of controls signals to increase the drive strength of the push-pull circuit in response to the respective one of the plurality of delay signals transitioning in the time window.

In some embodiments, over a plurality of time windows set by the first signal and the second signal, the drive strength controller is configured to change a number of the plurality of drive strength signal generators that increase the drive strength of the push-pull circuit during ramp periods corresponding to the plurality of time windows.

In some embodiments, the input circuit includes a plurality of time intervals forming a plurality of pairs of consecutive time intervals such that two consecutive pairs comprise a common interval. The measurement circuit is configured to measure a plurality of average time interval durations for the plurality of pairs of consecutive time intervals.

In another embodiment, a circuit includes a detection circuit and an output circuit. The detection circuit is configured to detect midpoints of a plurality of time intervals of an input signal, where the input signal includes a plurality of cycles, each cycle of the plurality of cycles comprising two time intervals of the plurality of time intervals. The output circuit is configured to set durations of consecutive time intervals of an output signal according to the detected midpoints of the plurality of time intervals of the input signal.

In some embodiments, the output circuit is configured to: generate an intermediate signal that performs rising transitions in response to the detected midpoints, and generate the output signal in response to the rising transitions and not the falling transitions of the intermediate signal.

In some embodiments, the plurality of time intervals include a plurality of consecutive time intervals, and the detection circuit is configured to detect midpoints of the plurality of consecutive time intervals.

In some embodiments, the detection circuit is configured to generate a first pair of complementary signals and a second pair of complementary signals in response to the detected midpoints of the plurality of time intervals, where the first pair and the second pair of complementary signals perform respective transitions in response to alternating detected midpoints.

In some embodiments, the output circuit is configured to receive the first pair and the second pair of complementary signals, and generate a set of signals, each signal of the set configured to perform respective rising and falling transitions in response to rising transitions of a different one of a plurality of combinations of two signals from the first pair and the second pair of complementary signals.

In some embodiments, the output circuit is configured to halve pulse widths of a first set of signals to generate a second set of signals.

In some embodiments, the output circuit is further configured: combine pulses of the second set of signals to generate a combined signal; and generate the output signal to perform rising and falling transitions in response to rising transitions and not falling transitions of the combined signal.

In another embodiment, a system includes an input circuit, a ramp generation circuit, a cross-point detection circuit, and an output circuit. The input circuit is configured to receive a pair of complementary input signals that include a first input signal and a second input signal. The ramp generation circuit is configured to generate a first pair of complementary ramp signals that transition over time durations corresponding to pulse durations of pulses of the first input signal, and generate a second pair of complementary ramp signals that transition over time durations corresponding to pulse durations of pulses of the second input signal. The cross-point detection circuit is configured to detect a plurality of consecutive cross-points of the first and second pairs of complementary ramp signals. The output circuit is configured to set durations of consecutive intervals of an output signal in response to detection of the plurality of consecutive cross-points of the first and second pairs of complementary ramp signals.

In some embodiments, a frequency division circuit is configured to generate first and second pairs of complementary signals based on alternating rising and falling transitions of the input signal, and the ramp generation circuit includes a push-pull circuit configured to linearly increase drive strengths over the durations corresponding to the pulse durations of the pulses of the first and second input signals in order to generate the first and second pairs of complementary ramp signals.

In another embodiment, a circuit includes: means for generating pairs of complementary ramp signals that ramp up and ramp down over ramp periods corresponding to time durations of time intervals of an input signal; means for detecting cross-points of the pairs of complementary ramp signals; and means for generating an output signal that performs rising and falling transitions in response to the detected cross-points.

In another embodiment, a method includes: frequency dividing an input signal to generate a first set of pre-intermediate signals; generating a second set of pre-intermediate signals that transition over ramp periods corresponding to time windows established by the first set of pre-intermediate signals; generating a set of intermediate signals that transition in response to detected cross-points of the second set of pre-intermediate signals; generating a first set of post-intermediate signals based on combinations of two signals of the set of intermediate signals; halving pulse widths of pulses of the first set of post-intermediate signals to generate a second set of post-intermediate signals; combining pulses of the second set of post-intermediate signals to generate a third post-intermediate signal; and frequency dividing the third post-intermediate signal to generate an output signal.

Other embodiments are possible, and each of the embodiments can be used alone or together in combination. Accordingly, various embodiments will now be described with reference to the attached drawings.

The present description describes various embodiments of apparatuses, devices, systems, circuits, and methods for performing duty cycle correction. The embodiments perform duty cycle correction through an averaging process where a time duration of a time interval of an output signal is set to an average time interval duration of two consecutive time intervals of an input signal. In particular embodiments, the averaging process is an instantaneous or on-the-fly averaging process in that the duration of each time interval of the output signal is individually or uniquely set to an average of a duration of the corresponding time interval of the input signal and the duration of the of the next time interval immediately following the corresponding time interval of the input signal.

The duty cycle correction processes described herein are performed to correct duty cycle distortion in an input clock signal or other input signal that has a magnitude waveform resembling that of a clock signal. In general, a clock signal is a signal that has repetitive cycles of the same time duration. The amount of the time duration is the period of the clock signal, and the inverse of the period is the frequency of the clock signal. Each cycle includes two time intervals, including a first time interval and a second time interval. During the first time interval, the magnitude, such as the voltage magnitude, of the clock signal is at an associated first level, and during the second time interval, the magnitude of the clock signal is at an associated second level. The first and second levels are different from each other, where one of the levels is an associated high level and the other is an associated low level. So, for example, in a given cycle of the clock signal, if the clock signal at the associated high level in the first time interval, then the clock signal is at the associated low level in the second time interval, and if the clock signal is at the associated low level in the first time interval, then the clock signal is at the associated high level in the second time interval. Because the clock signal has repeating cycles, then in each of the cycles, the first time interval occurs first in time and the second time interval occurs second in time—i.e., after the first time interval. After the second time interval of one cycle occurs, the first time interval of a next cycle occurs.

Two cycles or a pair of cycles of a signal that occur sequentially or consecutively in time are referred to as consecutive cycles. For a given current cycle, the cycle occurring immediately after the current cycle is the next cycle and the cycle that occurred immediately before the current cycle is the prior cycle. In addition, two time intervals or a pair of consecutive time intervals of a signal that occur sequentially or consecutively in time are referred to herein as consecutive time intervals. The first and second time intervals of the same cycle are consecutive cycles. In addition, the second time interval of a current cycle and the first time interval of a next cycle are consecutive time intervals. Also, the second time interval of a prior cycle and the first time interval of a current cycle are consecutive time intervals.

Herein, a time interval may also be referred to as a half cycle of one complete cycle. However, the term "half cycle," like time interval, is not limited to meaning exactly half the time duration of the complete cycle, but instead generally refers to the portion of a given cycle that the clock signal is at the high level or the low level, irrespective of the actual percentage of the total period that the half cycle consumes.

Also, as used herein, a level of a signal at a given point in time is a magnitude value, such as a voltage magnitude value or a current magnitude value. In general, a high level and a low level are both magnitude values where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

In addition or alternatively, a given signal may transition between a high level and a low level according to a swing requirement that sets or identifies a minimum high level and a maximum low level. A signal that transitions according to the swing requirement may transition to a high level that is, at or above, the minimum high level of the swing requirement, and may transition to a low level that is, at or below, the maximum low level of the swing requirement.

In addition or alternatively, for a given voltage that is applied to a gate terminal of a p-channel metal-oxide-semiconductor field-effect transistor (PMOS transistor), the high level of the given voltage is a level that turns off or is capable of turning off the PMOS transistor, and the low level of the given voltage is a level that turns on or is capable of turning on the PMOS transistor. Similarly, for a given voltage that is applied to a gate terminal of an n-channel metal-oxide-semiconductor field-effect transistor (NMOS transistor), the high level of the given voltage is a level that turns on or is capable of turning on the NMOS transistor, and the low level of the given voltage is a level that turns off or is capable of turning off the NMOS transistor.

In addition, a signal performs transitions in between being at its high and low levels. In particular, a signal may perform a rising transition when the signal transitions from its low level to its high level, and may perform a falling transition when the signal transitions from its high level to its low level. The signal performs transitions to transition between first and second time intervals of a cycle and to transition between the second time interval of one cycle and the first time interval of a next cycle. So, for example, if the signal is at its high level during a first time interval of a cycle, the signal may perform a falling transition to be at its low level during a second time interval of the cycle. As another example, if the signal is at its low level during a second time interval of a cycle, the signal may performing a rising transition to be at its high level during a first time interval of a next cycle.

A portion of a magnitude waveform of a signal over a transition is referred to as an edge. In particular, a portion of the magnitude waveform over a rising transition is a rising edge and a portion of the magnitude waveform over a falling transition is a falling edge. In general, since clock signals having repeating patterns, then the waveform of a clock signal includes a repeating pattern of alternating rising and falling edges in between periods that the clock signal is alternatingly at its high level and low level.

In addition, a signal may include pulses that are formed or defined by the rising and falling edges of the signal. In particular example configurations, the pulses of a signal may correspond to the high level of the signal, in that each pulse is defined by a rising edge followed by a period where the signal is at its high level, and then followed by a falling edge. A pulse width of a given pulse is a time duration extending from a time that the magnitude of the rising edge of the pulse is at or rises to a predetermined level (e.g., 50% of the high level) to a time that the magnitude of the falling edge of the pulse is at or falls to the predetermined level. The pulses of the signal may occur according to the frequency of the signal.

In addition, a signal may have an associated duty cycle. As used herein, a duty cycle of a signal is the percentage or fraction of one period that the signal is at its high level. In addition or alternatively, the duty cycle of a signal is the ratio of a pulse width of a pulse in a single period or cycle of the signal to a total time duration of the period or cycle.

The duty cycle correction performed herein may be performed to correct duty cycle distortion in a single input signal or a pair of complementary input signals. As used herein, two signals of a pair are complementary in that when one of the signals is at an associated high level the other is at an associated low level. The waveforms of two complementary signals are considered to inversely track each other in that when one signal performs a rising transition, the other signal performs a falling transition. In addition or alternatively, two signals that are complementary are 180-degrees out of phase with each other or have waveforms representative of two signals that are 180-degrees out of phase with each other.

For a pair of complementary signals, when a first signal of the pair is performing a rising transition, a second signal of the pair is performing a falling transition, or in the event that the rising and falling transitions are not occurring concurrently, then the transition of the second signal that is occurring closest in time to the rising transition of the first signal is a falling transition. Similarly, when the first signal of the pair is performing a falling transition, the second signal is performing a rising transition, or in the event that the rising and falling transitions are not occurring concurrently, then the transition of the second signal that is occurring closest in time to the falling transition of the first signal is a rising transition.

FIG. 1 is a block diagram of an example duty cycle correction system 100 implemented as a circuit that includes a measurement circuit 102 and an output circuit 104. The measurement circuit 102 is an input circuit of the duty cycle correction system 100. The measurement circuit 102 is a circuit that processes one or more input signals IN to perform duty cycle correction. FIG. 1 shows the measurement circuit 102 configured to receive a single input signal IN, although in other configurations, the measurement circuit 102 is configured to receive a pair of complementary input signals including a first input signal and a second input signal. Additionally, the output circuit 104 is a circuit configured to output one or more output signals corrected for duty cycle distortion. FIG. 1 shows the output circuit 104 configured to output a single output signal OUT, although in other configurations, the output circuit 104 is configured to output a pair of complementary output signals including a first output signal and a second output signal.

FIG. 2 shows a timing diagram of an example input signal IN received by the measurement circuit 102 and an example output signal OUT output by the output circuit 104. Each of the input and output signals IN, OUT are shows as clock signals or having clock signal waveforms.

In addition, each of the signals includes a plurality of consecutive (or consecutively occurring) intervals. FIG. 2 shows and labels five intervals for each of the signals. Each interval of each signal has an associated time duration. For a given signal, a time duration of an internal an amount of time that the interval occur at a particular point of a path over which the given signal propagates. The time duration may be quantified in various ways. For example, the time duration may be the amount of time that the signal is at the high level or the low level for the time interval. As another example, the time duration may include transition time amounts in addition to the amount of time that the signal is at the high or low level. A transition time amount is a time that the signal takes to transition from a predetermined level to either the high level when the signal is performing a rising transition or to the low level when the signal is performing a falling transition. The predetermined level is a level in between the high level and the low level, and in some embodiments, is represented as a percentage (e.g., 50%) below the high level. For such examples, a time duration for a time interval where the signal is at its high level includes a first transition time amount for the signal to transition from the predetermined level up to the high level, a time amount that the signal is at the high level, and a second transition time amount for the signal to transition from the high level down to the predetermined level. In addition, a time duration for a time interval where the signal is at its low level includes a first transition time amount for the signal to transition from the predetermined level down to the low level, a time amount that the signal is at the low level, and a second transition time amount for the signal to transition from the low level up to the predetermined level. Other ways of quantifying a time duration of a time interval may be possible. FIG. 2 shows the input signal including a first time interval having a first time duration Ta, a second time interval having a second time duration Tb, a third time interval having a third time duration Tc, a fourth time interval having a fourth time duration Td, and a fifth time interval having a fifth time duration Te.

The time durations of the time intervals of a signal over which the magnitude of the signal is at its high level may set instantaneous duty cycles of the signal. For example, with respect to the first input signal IN, an instantaneous duty cycle over a cycle defined by the first and second intervals is the first time duration Ta divided by the sum of the first and second time intervals Ta+Tb. Another instantaneous time duty cycle over a cycle defined by the third and fourth intervals is the third time duration Tc divided by the sum of the third and fourth time durations Tc+Td.

The input signal IN may be configured to have a target duty cycle. In particular example configurations, the target duty cycle is 50%. A signal that propagates with exactly a 50% duty cycle over all of its cycles has all of the time durations for all of its time intervals equal to the same amount. So, if the input signal IN propagated with exactly a 50% duty cycle over all of its cycles, the first, second, third, third, fourth, and fifth time durations Ta, Tb, Tc, Td, Te would all be equal to each other.

For a given cycle of a signal, if its associated instantaneous duty cycle is at or equal to the target duty cycle, that cycle does not have duty cycle distortion (or has zero duty cycle distortion). On the other hand, if a given cycle of a signal has an associated instantaneous duty cycle that is different than the target duty cycle, such as by either being greater than or less than the target duty cycle, then that given cycle has duty cycle distortion. The amount that that instantaneous duty cycle is different than the target duty cycle quantifies the amount or degree of the duty cycle distortion of the cycle—i.e., the more that the instantaneous duty cycle is different than the target duty cycle, the greater duty cycle distortion that cycle has. Due to process, temperature, and voltage (PVT) fluctuations, the time durations of the time intervals of the input signal IN and in turn their instantaneous duty cycles, may vary. For example, over several cycles, some cycles may have zero duty cycle distortion while others have duty cycle distortion, and those cycles that have duty cycle distortion may have the same or varying amounts from each other.

Referring back to FIG. 1, the duty cycle correction system 100 corrects for duty cycle distortion in the input signal IN by averaging time interval durations of consecutive time intervals of the input signal IN and setting corresponding time durations of time intervals of the output signal OUT to determined average time interval durations. An average time interval duration of a pair of consecutive time intervals is an average of a time duration of a first time interval of the pair and a time duration of a second time interval of the pair, or mathematically, the sum of the time duration of the first time interval and the time duration of the second time interval divided by two.

In the system 100, the measurement circuit 102 is a circuit that measures an average time duration of a pair of consecutive time intervals of the input signal IN. In some example embodiments, as described in further detail below, the measurement circuit 102 includes a detection circuit that detects midpoints of the time intervals of the pair of consecutive time intervals. A midpoint of a time interval is a middle point in time between a start time and an end time of the time duration of the time interval. The midpoint that the detection circuit detects may or may not be the actual midpoint of the time interval, but it is at least the point during the time interval that the detection circuit detects as being the midpoint of the time interval. Accordingly, the measurement circuit 102 may first detect the midpoint of the first time interval of the pair, and then detect the midpoint of the second time interval of the pair. In one embodiment, the time duration from the first midpoint to the second midpoint is the average time interval duration of the pair of consecutive time intervals.

The measurement circuit 102 may measure consecutive average time durations for each pair of second intervals of the input signal IN. Otherwise stated, the measurement circuit 102 may measure consecutive pairs of consecutive time intervals of the input signal IN. Two consecutive pairs of the consecutive time intervals share a common time interval. To illustrate with respect to FIG. 2, the input signal IN includes a first pair of consecutive time intervals comprising the first and second time intervals, and a second pair of consecutive time intervals comprising the second and third time intervals. The first and second pairs are consecutive in that they share (or both include) the second time interval. In this context, the measurement circuit 102 measures a first average time interval duration of the first and second time intervals, a second average time interval duration of the second and third time intervals, a third average time interval duration of the third and fourth time intervals, and so on.

The output circuit 104 is a circuit that sets time durations of the time intervals of the output signal OUT to the average time interval durations. For a given time interval of the output signal OUT, the output circuit 104 sets the time duration for the given time interval to the average time interval duration that corresponds to the given time interval. The average time interval duration that corresponds to the given time interval of the output signal is the average time interval duration that is an average of a pair of consecutive time intervals of the input signal IN, where the given time interval of the output signal OUT corresponds to the earlier-occurring interval of the pair of consecutive time intervals of the input signal IN. Between the input signal IN and the output signal OUT, a time interval of the input signal IN corresponds to a time interval of the output signal OUT when their relative order or temporal positionings with their respective signals IN, OUT are the same. That is, the duty cycle correction system 100 is configured to generate the output signal OUT with the same number of cycles as the input signal IN it receives. So, if the duty cycle correction system 100 receives one-hundred cycles of the input signal IN, the duty cycle correction system 100 will generate one-hundred cycles of the output signal OUT based on those one-hundred cycles of the input signal IN. Since the cycles of a signal occur sequentially, the plurality of cycles for a sequence of cycles, with each cycle having a temporal positioning in the sequence corresponding to when the cycle occurs relative to the other cycles. At a given point in a path over which the signal propagates, a first cycle of the sequence occurs first, a second cycle of the sequence occurs second, and so on. Between the input signal IN and the output signal OUT, two cycles, one being in the input signal IN and the other being in the output signal OUT, correspond to each other if they have the same temporal positionings in their respective input and output signals IN, OUT. Similarly, the time intervals making up the cycles occur sequentially, and so they too have temporal positionings corresponding to when they occur relative to the other cycles. Accordingly, between the input signal IN and the output signal OUT, two intervals, one being in the input signal IN and the other being in the output signal OUT, correspond to each other if they have the same temporal positionings in their respective input and output signals IN, OUT.

To illustrate with respect to FIG. 2, the input signal IN and the output signal OUT are shown as both having a respective sequence of five time intervals. The first time interval of the input signal IN corresponds to the first time interval of the output signal OUT, the second time interval of the input signal IN corresponds to the second time interval of the output signal OUT, and so on. With respect to the first two time intervals of the input signal IN, the measurement circuit 102 may measure the average time interval duration of the first two time intervals. Since the first time interval of the input signal IN is the earlier-occurring time interval of the pair, then the output circuit 104 sets the time duration of the first interval of the output signal OUT to the average time interval duration of the first and second time intervals, (Ta+Tb)/2, of the input signal IN, as indicated in FIG. 2. Similarly, with respect to the measurement circuit 102 may measure the average time interval duration of the second and third time intervals of the input signal IN. Since the second time interval of the input signal IN is the earlier-occurring time interval of the pair, then the output circuit 104 sets the time duration of the second interval of the output signal OUT to the average time interval duration of the second and third time intervals, (Tb+Tc)/2, of the input signal IN, as indicated in FIG. 2.

In order for the output circuit 104 to generate the output signal OUT (or a pair of complementary output signals), the measurement circuit 102 may be configured to generate a set of intermediate signals IA, IB, IC, ID (collectively referred to as the intermediate signals I) in response to receipt of the input signal IN (or a pair of complementary input signals) and output the set of intermediate signals I to the output circuit 104. Herein, an intermediate signal is a signal that the duty cycle correction system 100 generates in response to receipt of the input signal IN and that the duty cycle correction system 100 generates in order to generate the output signal OUT. As described in further detail below, the set of intermediate signals I may be just one of a plurality of sets of intermediate signals that the duty cycle correction system 100 generates in order to generate the output signal OUT.

As previously mentioned, the measurement circuit 102 may be configured to detect midpoints of the time intervals of the input signal IN. The measurement circuit 102, may further be configured to generate the plurality of intermediate signals I to perform rising and falling transitions in response to and/or at times indicating the detected midpoints.

FIG. 3 is a timing diagram of example waveforms of the set of intermediate signals I that the measurement circuit 102 may generate in response to receipt of the input signal IN as shown in FIG. 2. FIG. 3 shows the set of intermediate signals I as including two pairs of complementary signals, a first pair including first and third intermediate signals IA, IC and the second pair including second and fourth intermediate signals IB, ID. The first pair IA, IC and the second pair IB, ID perform their respective rising and falling transitions in response to alternating detected midpoints. For example, the first pair IA, IC performs rising and falling transitions in response to detected midpoints of the first, third, and fifth time intervals of the input signal IN, and the second pair IB, ID performs rising and falling transitions in response to detected midpoints of the second and fourth time intervals of the input signal IN. FIG. 3 further illustrates the first pair IA, IC performing first rising and falling transitions at a first time t1 corresponding to the midpoint Ta/2 of the first time interval, the second pair IB, ID performing second rising and falling transitions at a second time t2 corresponding to the midpoint Tb/2 of the second time interval, the first pair IA, IC performing third rising and falling transitions at a third time t3 corresponding to the midpoint Tc/2 of the third time interval, and so on. As described in further detail below, the output circuit 104 is configured to use the set of intermediate signals I performing transitions in that alternating manner and at times corresponding to the detected midpoints in order to generate the output signal OUT with time intervals having time durations set to the measured average time interval durations.

Figure 4:
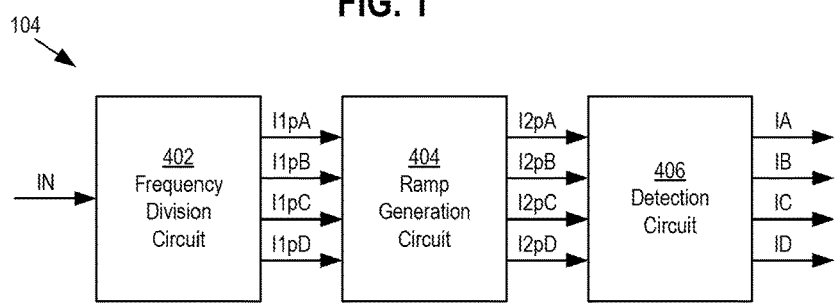
FIG. 4 is a block diagram of an example configuration of the measurement circuit of FIG. 1.

FIG. 4 is a block diagram of an example configuration of the measurement circuit 102 to generate the set of intermediate signals I, such as those shown in FIG. 3. The example configuration includes a frequency division circuit 402, a ramp generation circuit 404, and a detection circuit 406. Each of the frequency division circuit 402 and the ramp generation circuit 404 are configured to generate and output their own set of intermediate signals based on the input signal IN in order for the detection circuit 406 to output the set of intermediate signals I. For clarity, the intermediate signals that the frequency division circuit 402 and the ramp generation circuit 404 generate and output are referred to as pre-intermediate signals.

Figure 5:
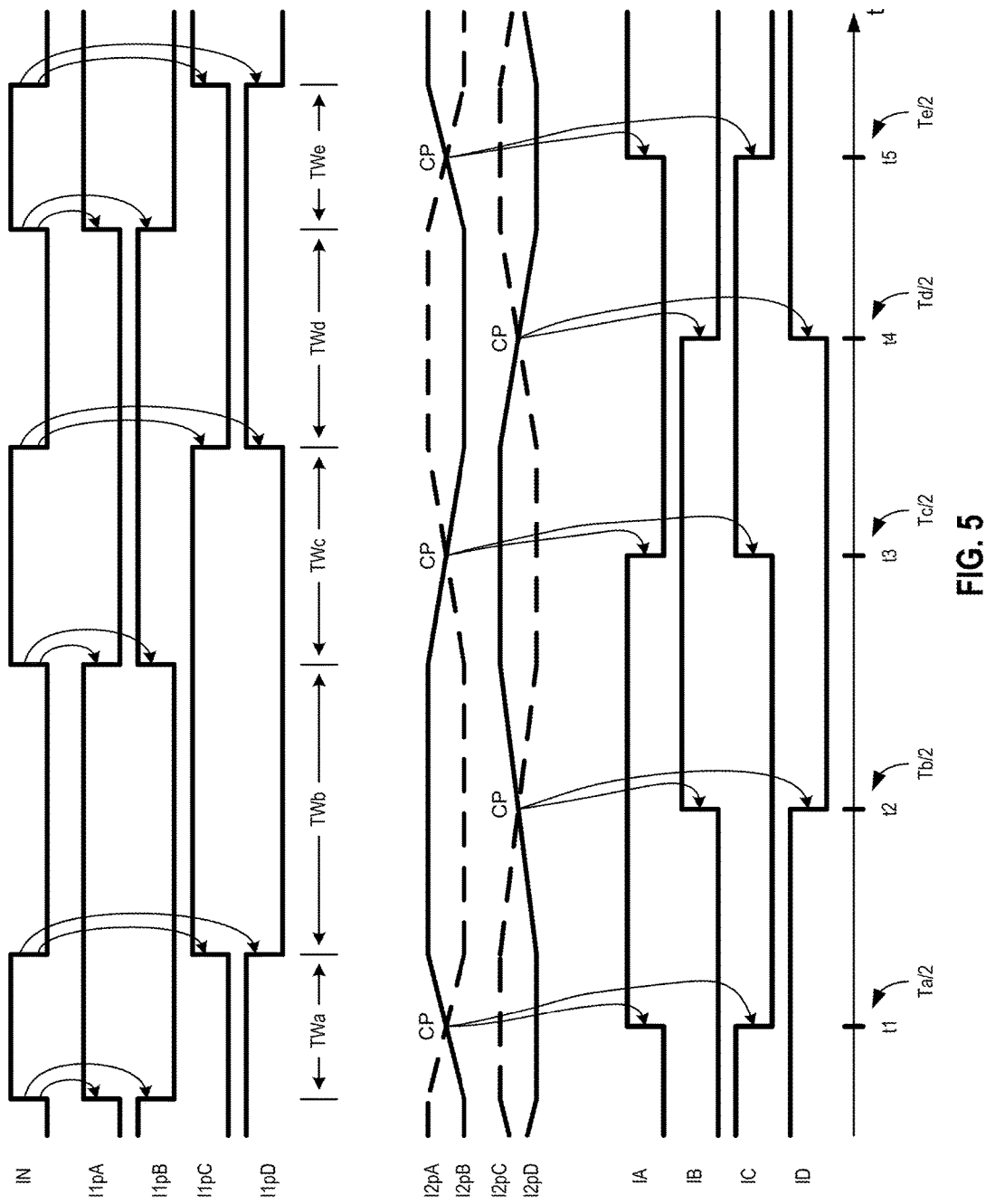
FIG. 5 is a timing diagram of example intermediate signals generated with the circuit components of the example configuration of the measurement circuit of FIG. 4.

FIG. 5 is a timing diagram of a first set of pre-intermediate signals I1*p*A, I1*p*B, I1*p*C, I1*p*D (collectively referred to as a first set of pre-intermediate signals I1*p*) that the frequency division circuit 402 is configured to output. In general, the first set of pre-intermediate signals I1*p* that the frequency division circuit 402 generates and outputs are frequency-divided versions of the input signal IN, and in particular, are frequency-divided by a factor of two, meaning that the first set of pre-intermediate signals I1*p* have half the frequency as the frequency of the input signal IN, or otherwise stated, have time intervals that are twice as long as the time intervals of the input signal IN.

In further detail, the frequency division circuit 402 may be configured to receive the input signal IN (or a pair of complementary input signals) and generate the first set of pre-intermediates signals I1*p* in response to receipt of the input signal IN. In this context, the frequency division circuit 402 may function or operate as an input circuit of the measurement circuit 102 in that it is the circuit (or circuit component) of the measurement circuit 102 that receives the input signal IN. Other example configurations of the measurement circuit 102 may include additional circuitry in front of (or upstream to) the measurement circuit 102 that operations as the input circuit and sends one or more signals to the measurement circuit 102 in response to receipt of the input signal IN. An example type of additional input circuit may be configured to receive a single-ended input signal and convert the single-ended input signal to a pair of complementary signals.

The frequency division circuit 402 may generate the first set of pre-intermediate signals I1*p* as two pairs of complementary signals, with the first pair including first and second pre-intermediate signals I1*p*A, I1*p*B, and the second pair including third and fourth pre-intermediate signals I1*p*C, I1*p*D. The frequency division circuit 402 may generate the first and second pairs of complementary signals based on alternating rising and falling transitions of the input signal IN. In particular with respect to FIG. 5, the frequency division circuit 402 may generate the first pair of pre-intermediate signals I1*p*A, I1*p*B to transition in response to rising edges of the input signal IN, and generate the second pair of pre-intermediate signals I1*p*C, I1*p*D to transition in response to falling edges of the input signal IN. FIG. 5 includes arrows to show the transitions of the first pair of pre-intermediate signals I1*p*A, I1*p*B and the second pair of pre-intermediate signals I1*p*C, I1*p*D transitioning in response to rising and falling edges of the input signal IN, respectively.

The frequency division circuit 402 may be configured in any of different ways and/or using any of different types of circuit topologies to frequency divide, such as by dividing in half, the frequency of the input signal IN. Example configurations may include flip flops, such as D flip flops, that feedback an output (e.g., a Qn output) back to an input, such as a D input. The number of flip flops may depend on whether the frequency division circuit 402 is configured to receive a single input signal IN or a pair of complementary input signals. One particular example configuration may include four flip flops, each configured to generate one of the pre-intermediate signals I1*p* of the first set. Various frequency division circuit configurations are possible.

Different combinations of two signals of the first set of pre-intermediate signals I1*p* may establish a plurality of time windows TW equal in duration to the time durations of the time intervals of the input signal IN. A given combination includes an associated first pre-intermediate signal and an associated second pre-intermediate signal. Each combination establishes a set of time windows TW of the plurality of time windows. For a given time window TW that a given combination establishes, a transition of the associated first pre-intermediate signal sets a start time of the given time window TW, and a transition of the associated second pre-intermediate signal sets an end time of the given time window TW, where the transition of the associated second pre-intermediate is the transition of the associated second pre-intermediate signal that occurs closest in time after occurrence of the transition of the associated first pre-intermediate signal.

In a particular example configuration in accordance with FIG. 5, a first combination includes the first pre-intermediate signal I1pA and the third pre-intermediate signal I1pC. Accordingly, as indicated in FIG. 3, a rising transition of the first pre-intermediate signal I1pA may set a start time of a time window TWa, and a rising transition of the third pre-intermediate signal I1pC occurring closest in time after the rising transition of the first pre-intermediate signal I1pA sets an end time of time window TWa. A duration of time window TWa may be equal to the first time duration Ta of the first time interval. Also, as shown in FIG. 5, a falling transition of the first pre-intermediate signal I1pA may set a start time of a time window TWc, and a falling transition of the third pre-intermediate signal I1pC occurring closest in time after the falling transition of the first pre-intermediate signal I1pC sets an end time of time window TWc. A duration of time window TWc may be equal to the third time duration Tc of the third time interval. Additionally, another rising transition of the first pre-intermediate signal I1pA may set a start time of a time window TWe, and another rising transition of the third pre-intermediate signal I1pC occurring closest in time after the rising transition of the first pre-intermediate signal I1pA sets an end time of time window TWe. A duration of time window TWe may be equal to the fifth time duration Te of the fifth time interval.

Other combinations may similarly set time durations of other time windows. For example, with reference FIG. 5, a second combination includes the third pre-intermediate signal I1pC and the second pre-intermediate signal I1pB. Accordingly, as indicated in FIG. 5, a rising transition of the third pre-intermediate signal I1pC may set a start time of a time window TWb, and a rising transition of the second pre-intermediate signal I1pB occurring closest in time after the rising transition of the third pre-intermediate signal I1pC sets an end time of time window TWb. A duration of time window TWb may be equal to the second time duration Tb of the second time interval. In addition, a falling transition of the third pre-intermediate signal I1pC may set a start time of a time window TWd, and a falling transition of the second pre-intermediate signal I1pB occurring closest in time after the falling transition of the third pre-intermediate signal I1pD sets an end time of the time window TWd. A duration of time window TWd may be equal to the fourth time duration Td of the fourth time interval.

Other combinations of two signals from the first set of pre-intermediate signals I1p may similarly set the time windows TW. For example, a third combination may include the second pre-intermediate signal I1pB setting start time of time windows and the fourth pre-intermediate signal I1pD setting end times of the time windows. A fourth combination may include the fourth pre-intermediate signal I1pD setting start times of time windows and the first pre-intermediate signal I1pA setting end times of the time windows. Other combinations may be possible. In general, for a given combination, one of the signals of the combination is from the first pair of complementary signals I1pA, I1pB, and the other signal of the combination if from the second pair of complementary signals I1pC, I1pD.

The ramp generation circuit 404 may be configured to receive the first set of pre-intermediate signals I1p and generate a second set of pre-intermediate signals I2p in response to receipt of the first set of pre-intermediate signals I1p. The pre-intermediate signals I2p of the second set may be referred to as ramp signals that perform rising and falling transitions by ramping up and ramp down over ramp periods equal and/or corresponding to the time durations of the time intervals of the input signal IN. In addition, as described in further detail below, the ramp periods over which the ramp generation circuit 404 ramps up and ramps down the ramp signals I2p may be set by the durations of the time windows established by the first set of pre-intermediate signals I1p.

In further detail, the ramp generation circuit 404 may be configured to generate the second set of pre-intermediate signals I2p as two pairs of complementary ramp signals, including a first pair of complementary ramp signals comprising first and second ramp signals I2pA, I2pB and a second pair of complementary ramp signals comprising third and fourth ramp signals I2pC, I2pD. The periods of time that the ramp signals I2p transition (by ramping up and ramping down) are referred to as ramp periods, which may be equal in duration to time durations of the time intervals of the input signal IN and the time windows TW established by the first set of pre-intermediate signals I1p. A pair of complementary ramp signals is a pair of signals that is both complementary as defined above, and that include two signals that are both ramp signals. For a given pair of complementary ramp signals, when a first ramp signal of the complementary pair is performing a rising transition by ramping up over the ramp period, a second ramp signal of the complementary pair is performing a falling transition by ramping down over the ramp period.

The first and second pairs of ramp signals may alternatingly transition over their respective ramp periods. As shown in FIG. 5, while the ramp generation circuit 404 transitions the first pair I2pA, I2pB, it maintains the second pair I2pC, I2pD at respective high and low levels, and while the ramp generation circuit 404 transitions the second pair I2pC, I2pD, it maintains the first pair I2pA, I2pB at respective high and low levels.

For configurations where the measurement circuit 102 receives a pair of complementary input signals, pulses of the complementary input signals may occur at alternating time intervals, due to complementary input signals propagating at alternating high and low levels. For such example configurations, the ramp generation circuit 404 may generate the pairs of complementary ramp signals to transition over durations corresponding to pulse durations of the alternating pulses of the complementary input signals. For example, the ramp generation circuit 404 may generate the first pair of complementary ramp signals to transition over time durations corresponding to pulse durations of pulses of the first input signal, and may generate the second pair of complementary ramp signals to transition over time durations corresponding to pulse durations of pulses of the second input signal.

As mentioned, when the ramp generation circuit 404 generates a given pair of the ramp signals to transition, the ramp generation circuit 404 may generate the given pair to transition over a duration equal to a duration of a respective one of the time windows TW established by the first set of pre-intermediate signals I1p. For example, as indicated in FIG. 5, the ramp generation circuit 404 may generate the first pair of ramp signals I2pA, I2pB to respectively ramp down (from the high level to the low level) and ramp up (from the low level to the high level) over a first ramp period equal in duration to a duration of time window TWa corresponding and/or equal in duration to the time duration Ta of the first time interval. During this first ramp period, the ramp generation circuit 404 generates the second pair I2pC, I2pD at respective high and low levels. Subsequently, as indicated in FIG. 5, the ramp generation circuit 404 may generate the second pair of ramp signals I2pC, I2pD to respectively ramp down and ramp up over a second ramp period equal in duration to a duration of time window TWb corresponding and/or equal in duration to the time duration Tb of the second time interval. During this second ramp period, the ramp generation circuit 404 generates the first pair I2pA, I2pB at respective low and high levels. The ramp generation circuit 404 may continue to generate the ramp signals I2p in this manner as cycles of the input signal IN are received and the frequency division circuit 402 outputs additional cycles of the first pre-intermediate signals I2p to the ramp generation circuit.

Over a given ramp period, the ramp generation circuit 404 may generate a given pair of complementary ramp signals to transition by continuously ramping up and ramping down over the ramp period. In particular example configurations, the continuous ramping is linear. That is, a slope of a magnitude of a given ramp signal ramping up (performing a rising transition) over a given ramp period is a linearly increasing slope from a beginning or start time of the ramp period to an end or end time of the ramp period. Likewise, a slope of a magnitude of a given ramp signal ramping down (performing a falling transition) over a given ramp period is a linearly decreasing slope from a beginning of the ramp period to an end of the ramp period. In general, a slope of a signal over a given period over which the signal propagates refers to rate at which a magnitude of the signal is changing over the given period. So, a linearly increasing slope over the given period means that the magnitude of the signal is increasing at a linear rate over the given period, and a linearly decreasing slope over the given period means that the magnitude of the signal is decreasing at a linear rate over the given period.

Also, since ramp generation circuit 404 may generate the ramp signals with linearly increasing and decreasing slopes over the duration of the ramp periods, the magnitudes of the slopes of the transitions will change according to changes in duration of the ramp periods. In general, the longer a ramp period, as set by a longer time window, the lower the magnitude of the slopes—i.e., the more gradual or lower the rate at which the ramp generation circuit 404 will increase and decrease the magnitudes a given pair of ramp signals over the ramp period. Similarly, the shorter the ramp period, as set by a shorter time window, the high the magnitude of the slopes—i.e, the steeper or higher the rate at which the ramp generation circuit 404 will increase and decrease the magnitudes of a given pair of ramp signals over the ramp period. So, in general, the frequency division performed by the frequency division circuit 402 on a cycle-by-cycle or on an interval-by-interval basis dynamically establishes time windows TW with durations corresponding to the time durations of the individual intervals of the input signal IN, which in turn causes the ramp generation circuit 404 to dynamically generate the ramp signals I2p with slopes corresponding to ramp periods equal in duration to the durations of the time windows TW of the first pre-intermediates signals I1p and the time interval of the input signal IN. As described in further detail below, the dynamic generation of the ramp signals on an interval-by-interval basis will allow the output circuit 104 to generate the output signal OUT with time intervals individually or dynamically set to the averages of consecutive pairs of consecutive intervals of the input signal IN.

Figure 6:
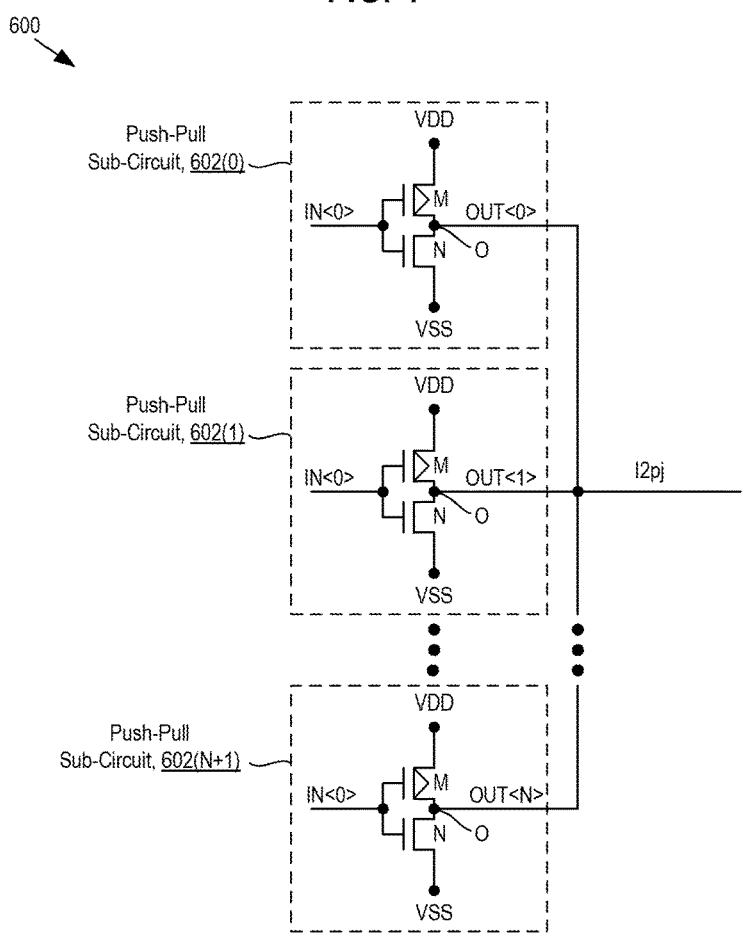
FIG. 6 is a circuit diagram of an example push-pull circuit used in a ramp generation circuit of FIG. 4.

For some example configurations, the ramp generation circuit 404 may include a plurality of push-pull circuits to generate the set of ramp signals I2p. FIG. 6 shows a circuit diagram of an example push-pull circuit 600 configured to generate a jth ramp signal I2pj, which may be representative of any of the ramp signals I2pA, I2pB, I2pC, I2pD. The push-pull circuit 600 includes a plurality of sub-circuits 602, each of which may be considered by itself a push-pull circuit.

Each of the push-pull sub-circuits 602 includes a p-channel metal-oxide-semiconductor field-effect transistor (PMOS transistor) M and an n-channel metal-oxide-semiconductor field-effect transistor (NMOS transistor) N. The PMOS transistor M and the NMOS transistor N may have their drain terminals connected together to form an output node. The PMOS transistor M may have its source terminal configured to receive a high supply voltage VDD, and the NMOS transistor N may have its source terminal configured to receive a low supply voltage VSS, such as a ground reference voltage, for example. In addition, the PMOS and NMOS transistors M, N may have their gate terminal connected together to form an input of the push-pull sub-circuit 602.

The PMOS and NMOS transistors M, N of a given ith push-pull sub-circuit 602(i) may operate together or in combination to generate an ith output voltage OUT<i>. When turned on, the PMOS transistor M of the ith push-pull sub-circuit 602(i) may operate to pull up the level of the ith output voltage OUT<i> toward the high supply voltage level VDD. In addition, when the NMOS transistor N of the ith push-pull sub-circuit 602(i) may operate to push down the level of the ith output voltage OUT<i> toward the low supply voltage level VSS. The PMOS and NMOS transistors M, N may operate so that they alternatingly turn on and turn off in response to receipt of an ith input signal IN<i>, such as an voltage signal, generated at an associated high level (e.g., the high supply voltage level VDD) or an associated low level (e.g., the low supply voltage level VSS). In particular, when the ith input signal IN<i> is at its associated high voltage level, the PMOS transistor M turns off and the NMOS transistor N turns on to pull down the ith output voltage OUT<i> to the low supply voltage level VSS. Alternatively, when the ith input signal IN<i> is at its associated low level, the NMOS transistor N turns off and the PMOS transistor M turns on to pull up the ith output voltage OUT<i> to the high supply voltage level VDD.

As shown in FIG. 6, the output nodes O of the push-pull sub-circuits 602 are connected together to generate the jth ramp signal I2pj. In other words, the voltage level of the jth ramp signal I2pj is a combination of voltage levels of the output signals OUT generated by the sub-circuits 602.

The push-pull drive circuit 600 may be configured to ramp up the voltage level of the jth ramp signal I2pj according to a pull-up drive strength, and may be configured to ramp down the voltage level of the jth ramp signal I2pj according to a push-down drive strength. As used herein, a pull-up drive strength is a measure of an ability or a strength that a push-pull circuit has to pull up a level, such as a voltage level, of its output signal to an associated high level. The greater the pull-up drive strength, the faster the push-pull circuit 600 can pull up the voltage level of the jth ramp signal I2pj, and the weaker the pull-up drive strength, the slower the push-pull circuit 600 can pull up the voltage level of the jth ramp signal I2pj. Similarly, a push-down drive strength is a measure of an ability or a strength that a push-pull circuit has to push down a level, such as a voltage level, of its output signal to an associated low level. The greater the push-down drive strength, the faster the push-pull circuit 600 can push down the voltage level of the jth ramp signal I2$pj$, and the weaker the push-down drive strength, the slower the push-pull circuit 600 can push down the voltage level of the jth ramp signal I2$pj$.

At a given moment in time, the pull-up drive strength of the push-pull circuit 600 corresponds to the number of PMOS transistors M of the push-pull circuit 600 that are turned on and pulling up the voltage levels of their respective output signals OUT. The push-pull circuit 600 is operating with maximum pull-up drive strength when all of the PMOS transistors M are turned on, and is operating with minimum pull-up drive strength when all of the PMOS transistors M are turned off. Likewise, at a given moment in time, the push-down drive strength of the push-pull circuit 600 corresponds to the number of NMOS transistors N of the push-pull circuit 600 that are turned off and pushing down the voltage levels of the their respective output signals OUT. The push-pull circuit 600 is operating with maximum push-down drive strength when all of the NMOS transistors N are turned on, and is operating with minimum push-down drive strength when all of the NMOS transistors N are turned off.

The push-pull circuit 600 may configured to ramp up and ramp down the jth ramp signal I2$pj$ with continuously increasing drive strengths during ramp periods. In particular example configurations, the push-pull circuit 600 may continuously increase its drive strengths by linearly increasing the drive strengths during the ramp periods. During a ramp period when the push-pull circuit 600 is ramping up the voltage level of the jth ramp signal I2$pj$, the push-pull circuit 600 may be configured to pull up the voltage level of the jth ramp signal I2$pj$ with a linearly increasing pull-up drive strength. To do so, the ramp period may be separated into a plurality of linear time increments. At the start of a ramp period during which the push-pull circuit 600 ramps up the voltage level of the jth ramp signal I2$pj$, the push-pull circuit 600 may start with an initial, such as a minimum pull-up drive strength, and increase its pull-up drive strength at each of the linear time increments over the duration of the ramp period. For example, at the start of the ramp period, an initial number of the push-pull sub-circuits 602 have their PMOS transistors M turned on. In some example configurations, the initial number is zero. In other example configurations, the initial number is one. Other initial numbers may be possible. Subsequently, at each time increment during the ramp period, a predetermined number of the push-pull sub-circuits 602 that had their PMOS transistors M turned off and their NMOS transistors N turned on switch such that their PMOS transistors M turn on and their NMOS transistors turn off, which in turn increases the pull-up drive strength of the push-pull circuit 600 by an amount corresponding to the number of PMOS transistors M that turned on at the time increment. In particular example configurations, only one of the push-pull sub-circuit 602 switches to turning on its PMOS transistor M at each time increment, although other numbers greater than one may be possible.

Additionally, during a ramp period when the push-pull circuit 600 is ramping down the voltage level of the jth ramp signal I2$pj$, the push-pull circuit 600 may be configured to push down the voltage level of the jth ramp signal I2$pj$ with a linearly increasing push-down drive strength. At the start of a ramp period during which the push-pull circuit 600 ramps down the voltage level of the jth ramp signal I2$pj$, the push-pull circuit 600 may start with an initial, such as a minimum push-down drive strength, and increase its push-down drive strength at each of the linear time increments over the duration of the ramp period. For example, at the start of the ramp period, an initial number of the push-pull sub-circuits 602 have their NMOS transistors N turned on. In some example configurations, the initial number is zero. In other example configurations, the initial number is one. Other initial numbers may be possible. Subsequently, at each time increment during the ramp period, a predetermined number of the push-pull sub-circuits 602 that had their NMOS transistors N turned off and their PMOS transistors M turned on switch such that their NMOS transistors N turn on and their PMOS transistors turn off, which in turn increases the push-down drive strength of the push-pull circuit 600 by an amount corresponding to the number of NMOS transistors N that turned on at the time increment. In particular example configurations, only one of the push-pull sub-circuit 602 switches to turning on its NMOS transistor N at each time increment, although other numbers greater than one may be possible.

As shown in FIG. 6, the plurality of push-pull sub-circuits 602 includes an (N+1)-number of push-pull sub-circuits 602. In example configurations, the number N is equal to or greater than a maximum expected number of time increments in a given ramp period. That is, if the input signal IN has varying instantaneous duty cycles—i.e, the time durations of the time intervals vary—the number of time increments within the ramp periods may correspondingly vary. To illustrate, suppose a time increment is 5 μs. Further, suppose due to duty cycle variation in the input signal IN, one ramp period corresponding to one time interval of the input signal IN is 40 μs and another ramp period corresponding to another time interval is 50 μs. Accordingly, the number of 5 μs time increments for the first and second ramp periods are different, the first ramp period having 8 time increments and the second ramp period having 10 time increments. In order to be able to adapt to the varying numbers of time increments for different ramp periods, the (N+1)-number of push-pull sub-circuits 600 may be equal to or greater than a maximum expected number of time increments so that the push-pull circuit 600 can linearly increase its pull-up or push-down drive strength to the end of the ramp periods for the various ramp periods.

Additionally, in particular example configurations, at the end of a ramp period during which the push-pull circuit 600 is ramping up the voltage level of the jth ramp signal I2$pj$, all of the push-pull sub-circuits 602 may turn on their respective PMOS transistors M so that by the end of the ramp period, the push-pull circuit 600 is operating with maximum pull-up drive strength to maintain the voltage level of the jth ramp signal I2$pj$ at its high voltage level during a next ramp period. So, for example, suppose a given ramp period has 10 time increments, the tenth time increment marking the end of the ramp period, and the push-pull circuit 600 has 30 push-pull sub-circuits 602. At the ninth time increment, a ninth push-pull sub-circuit 602 may turn on its PMOS transistor M, and then at the tenth time increment—the end of the ramp period—the remaining 20 push-pull sub-circuits 602 may switch to turning on their PMOS transistors M and turning off their NMOS transistors N. Similarly, at the end of a ramp period during which the push-pull circuit 600 is ramping down the voltage level of the jth ramp signal I2$pj$, all of the push-pull sub-circuits 602 may turn on their respective NMOS transistors N, regardless of the number of remaining NMOS transistors N left to turn on, so that by the end of the ramp period, the push-pull circuit 600 is operating with maximum push-down drive strength to maintain the voltage level of the jth ramp signal I2$pj$ at its low level during a next ramp period.

Figure 7:
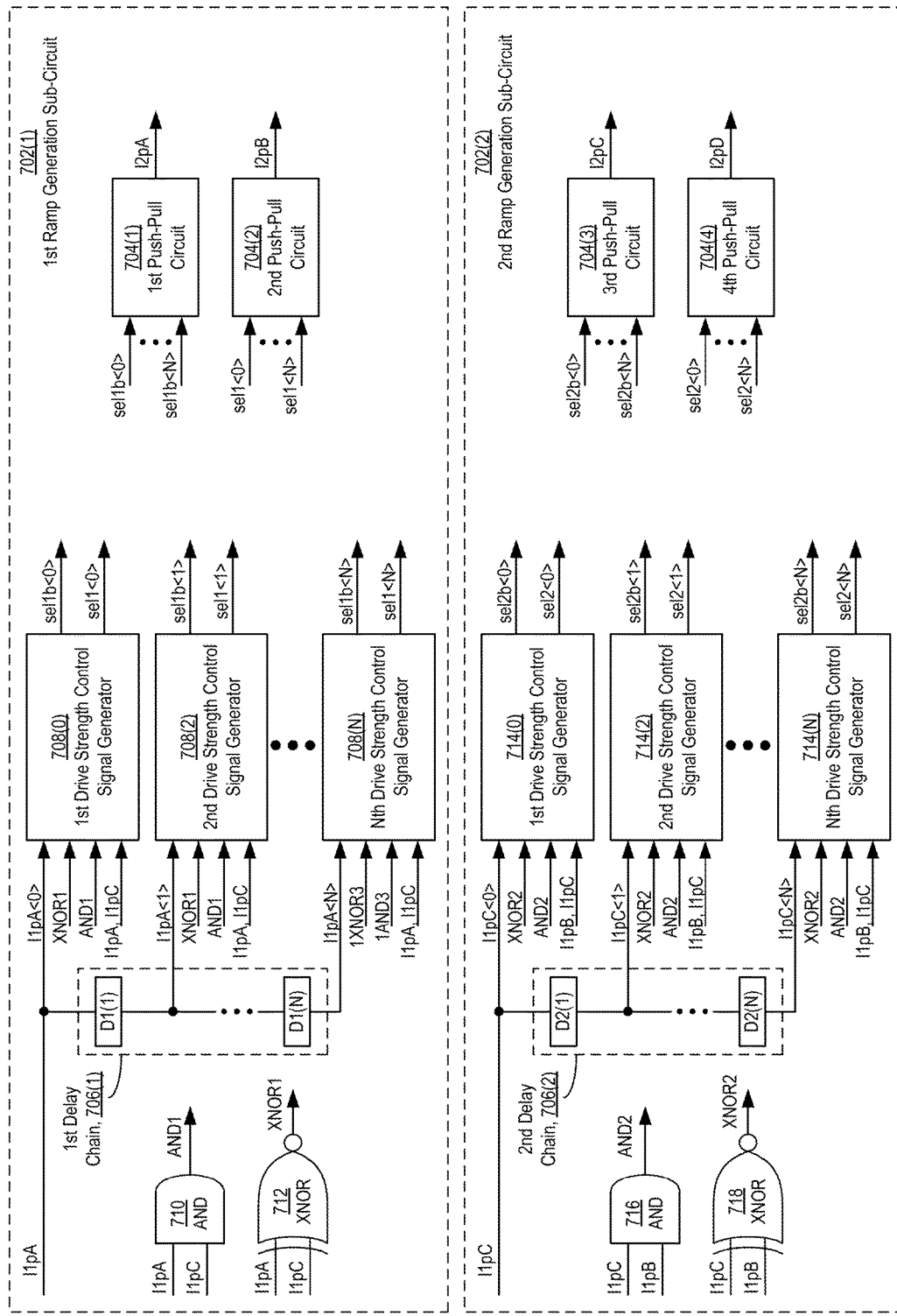
FIG. 7 is a block diagram of an example configuration of the ramp generation circuit of FIG. 4.

FIG. 7 is a block diagram of an example configuration of the ramp generation circuit 404. As shown in FIG. 7, the ramp generation circuit 404 may be separated into two ramp generation sub-circuits 702. A first ramp generation sub-circuit 702(1) is configured to generate the first pair of complementary ramp signals I2pA, I2pB, and a second ramp generation sub-circuit 702(2) is configured to generate the second pair of complementary ramp signals I2pC, I2pD. As shown in FIG. 7, the first ramp generation sub-circuit 702(1) may include a first push-pull circuit 704(1) configured to generate the first ramp signal I2pA of the first pair, and a second push-pull circuit 704(2) configured to generate the second ramp signal I2pA of the first pair. Also, the second ramp generation sub-circuit 702(2) may include a third push-pull circuit 704(3) configured to generate the third ramp signal I2pC of the second pair, and a fourth push-pull circuit 704(4) configured to generate the fourth ramp signal I2pD of the second pair. Each of the push-pull circuits 704(1), 704(2), 704(3), 704(4) may have the circuit configuration of and operate in accordance with the push-pull circuit 600 as previously described with reference to FIG. 6.

In general, each of the ramp generation sub-circuits 702 is configured to generate a plurality of delay signals based on one of the combinations of two signals of the first set of pre-intermediates signals I1p, and generate pairs of drive strength control signals sel, selb to cause the push-pull circuits 704 to generate the ramps signals I2p with linearly increasing drive strengths during the ramp portions based on those delay signals that fall within the time windows established by the combination. The ramp generation sub-circuits 702 each generate their respective delay signals based on the pre-intermediate signal of the associated combination that sets the start times of the time windows, and uses the pre-intermediate signal setting the end times to determine which of the delay signals fall within the time windows. In the example configuration of FIG. 7, the first ramp generation sub-circuit 704(1) uses the first combination of the first pre-intermediate signal Ip1A setting start times of time windows and the third pre-intermediate signal Ip1C setting end times of the time windows, the second ramp generation sub-circuit 704(2) uses the second combination of the third pre-intermediate signal Ip1C setting start times of time windows and the second pre-intermediate signal Ip1D setting end times of the time windows. Other configurations of the ramp generation circuit 404 may use other combinations.

In further detail, the first ramp generation sub-circuit 702(1) includes a first delay chain 706(1) configured to generate an N-number of delay signals I1pA<1> to I1pA<N>. In general, a delay signal refers to a signal that has an associated delay relative to a reference signal. The delay signal may be referred to as a delay signal of the reference signal. The delay signal performs transitions (including rising transitions and falling transitions) that correspond to transitions of the reference signal. As the reference signal and the delay signal propagate, the delay signal performs transitions at times relative to times that the reference signal performs corresponding transitions. The associated delay, such as the amount of delay, of the delay signal is defined by the amount of time that has elapsed from the time that the reference signal performs a transition to when the delay signal performs its corresponding transition. With respect to the first delay chain 706(1), the reference signal is the first pre-intermediate signal I1pA, and the delay signals are the N-number of delay signals I1pA<1> to I1pA<N>, each having an associated delay relative to the first pre-intermediate signal I1pA and to each other.

The first delay chain 706(1) includes an N-number of delay elements D1(1) to D1(N). Each of the delay elements D1 has an input configured to receive an input signal and delay its input signal a certain amount of time delay to generate an output signal. In particular example configurations, the amount of time delay corresponds to the time increments dividing the ramp periods. Except for the first delay element D1(1), each ith delay element D1(i) of the first delay chain 706(1) has its input coupled to an output of a prior (i−1)th delay element D1(i−1) and configured to receive the output signal of the prior (i−1)th delay element D1(i−1) as its input signal. Additionally, except for the last or Nth delay element D1(N) of the first delay chain 706(1), each ith delay element D1(i) is configured to send the output signal it generates to a next (i+1)th delay element D1(i+1). The output signals that the N-number of delay elements D1(1) to D1(N) generate are the plurality of delay signals I1pA<1> to I1pA<N> output by the first delay chain 706(1). Additionally, the first pre-intermediate signal I1pA may be referenced as an initial delay signal I1pA<0> of a plurality of delay signals I1pA<0> to I1pA<N>, having zero delay with reference to itself.

The first ramp generation sub-circuit 702(1) may further include a first drive strength controller that controls the drive strengths that the first and second push-pull circuits 704(1), 704(2) have when generating the first and second ramp signals I2pA, I2pB. As part of the control, the drive strength controller may continuously increase, such as by linearly increasing, the pull-up and push-down drive strengths of the first and second push-pull circuits 704(1), 704(2) during ramp periods based on a subset of the delay signals I1pA<0> to I1pA<N> that transition during the time windows corresponding to the ramp periods of the first and second ramp signals I2pA, I2pB.

The drive strength controller may control the drive strengths by being configured to generate a first set of drive strength control signals sel1, sel1b, and output the first set of drive strength control signals sel1, selb to the first and second push-pull circuits 704(1), 704(2) to control the turning on and off of the PMOS and NMOS transistors M, N of the push-pull sub-circuits (e.g., the push-pull sub-circuits 602 of FIG. 6) of the first and second push-pull circuits 704(1), 704(2). The drive strength controller is configured to increase the pull-up drive strength of the first push-pull circuit 704(1) by outputting the drive strength control signals selb to increase the number of PMOS transistor M of the first push-pull circuit 704(1) that are turned on, and to increase the push-down drive strength of the first push-pull circuit 704(1) by outputting the drive strength control signals selb to increase the number of NMOS transistors N of the first push-pull circuit 704(1) that are turned on. Similarly, the drive strength controller is configured to increase the pull-up drive strength of the second push-pull circuit 704(2) by outputting the drive strength control signals sel to increase the number of PMOS transistor M of the second push-pull circuit 704(2) that are turned on, and to increase the push-down drive strength of the second push-pull circuit 704(2) by outputting the drive strength control signals sel to increase the number of NMOS transistors N of the second push-pull circuit 704(2) that are turned on.

The first drive strength controller includes an (N+1)-number of drive strength control signal generators 708(0) to 708(N). Each ith drive strength control signal generator 708(i) is configured to generate an associated ith pair of drive strength control signals sel1<i>, sel1b<i> of the first set of drive strength control signals sel1, selb. In addition, each ith drive strength control signal generator 708(i) is configured to generate each of its associated ith pair sel1<i>, sel1b<i> at an associated high voltage level or an associated low voltage level. The associated high level is a level that turns off a PMOS transistor M of a push-pull circuit 704 and turns on a NMOS transistor N of the push-pull circuit 704, and the associated low level is a level that turns on the PMOS transistor M and turns off the NMOS transistor N. Also, at any given moment in time, an ith drive strength control signal generator 708(i) generates the ith pair of drive strength control signals sel1<i>, sel1b<i> at opposing high and low voltage levels. That is, when the ith drive strength control signal generator 708(i) is generating the first drive strength control signal sel1<i> of the pair at one of the high voltage level or the low level, it is generating the second drive strength control signal sel1b<i> at the other level.

In addition, the first drive strength control signal generator 708(0) is configured to receive the first pre-intermediate signal I1pA, indicated in FIG. 7 as a non-delayed version I1pA<0> of the first pre-intermediate signal I1pA, and the other drive strength control signal generators 708(1) to 708(N) are each configured to receive one of the delayed first pre-intermediate signals I1pA<1> to I1pA<N>. As shown in FIG. 7, each ith drive strength control signal generator 708(i) is configured to output its first drive strength control signal sel1<i> to the second push-pull circuit 704(1) for generation of the second ramp signal I2pA, and output its second drive strength control signal sel1b<i> to the first push-pull circuit 704(1) for generation of the first ramp signal I2pB.

During operation, when the first pre-intermediate signal I1pA performs a transition (either a rising transition or a falling transition), the first delay chain 706(1) will correspondingly transition each of the N-number of delay signals I1pA<1> to I1pA<N> at respective times following the transition of the first pre-intermediate signal I1pA corresponding to the amounts of delay relative to the first pre-intermediate signal I1pA with which the first delay chain 706(1) is configured to generate each of the delay signals I1pA<1> to I1pA<N>. When the first pre-intermediate signal I1pA performs the transition, it starts an associated time window that ends when the third pre-intermediate signal performs its next transition. If the end of the time window occurs before at least one of the delay signals I1pA<1> to I1pA<N> performs its corresponding transition, then less than all, referred to as a subset, of the delay signals I1pA<1> to I1pA<N> perform their corresponding transitions in the time window, and a remaining number of the delay signals I1pA<1> to I1pA<N> perform their corresponding transitions after or outside of the time window.

The first and second push-pull circuits 704(1), 704(2) will transition their ramp signals I2pA, I2pB during a ramp period having a duration equal and/or corresponding to the duration of the time window. For a given ith drive strength control signal generator 708(i) receiving an ith delay signal I1pA<i> that is one of the subset of delay signals that transitions in the time window, the ith drive strength control signal generator 708(i) will respond by changing the levels of each of its ith pair of drive strength control signals sel1<i>, sel1b<i> so that one of the first and second push-pull circuits 704(1), 704(2) increases its pull-up drive strength and the other of the first and second push-pull circuits 704(1), 704(2) increases its push-down drive strength. This change in levels of the drive strength control signals sel1<i>, sel1b<i> and corresponding increase in pull-up up and push-down drive strengths occurs at a time during the ramp period proportional to when the transition of the ith delay signal occurred in the time window. Collectively, for the subset of the delay signals I1pA<1> to I1pA<N> that perform corresponding transitions in the time window, a subset of the drive strength control signal generators 708(1) to 708(N) receiving the subset of the delay signals I1pA<1> to I1pA<N> will correspondingly change the levels of their drive strength control signals sel1<i>, selb<i> at times proportional to when the subset of delay signals I1pA<1> to I1pA<N> perform their corresponding transitions in the time window. This, in turn, causes the first and second push-pull circuits 704(1), 704(2) to continuously, such as linearly, increase pull-up and push-down drive strengths over the duration of the ramp period when generating the first and second ramp signals I2pA, I2pB over the ramp period.

Due to instantaneous duty cycle distortion in the input signal IN, the time windows established by the first pre-intermediate signals I1p may vary in duration from time interval to time interval. As the time windows vary in duration, the number of transitions of the delay signals I1pA<1> to I1pA<N> occurring in the time windows can vary. The N-number of delay elements D1(1) to D1(N) may be sufficiently great enough and the amount of delay that each of the delay elements D1(1) to D1(N) provide is large enough so that the last or Nth delay signal I1pA<N> output from the last delay element D1(N) of the first delay chain 706(1) correspondingly transitions with an amount of delay from the transition of the first pre-intermediate signal I1pA greater than or equal to a largest expected duration of a time window. As the time windows vary in duration, the number of delay signals I1pA<1> to I1pA<N> transitioning in the time windows will correspondingly vary. This, in turn, causes the drive strength controller to change the number of its drive strength control signal generators 708(0) to 708(N) that increase the pull-up and push-down drive strengths of the first and second push-pull circuits 704(1), 704(2) during the ramp periods corresponding to the plurality of time windows, providing a dynamic way of continuously increasing the pull-up and push-down drive strengths of the first and second push-pull circuits 704(1), 704(2) over ramp periods of different durations.

Further, during a non-ramp period during which the first ramp signal I2pA is to be at its high level and the second ramp signal I2pB is to be at its low level, each ith drive strength control signal generator 708(i) is configured to generate its associated first drive strength control signal sel1<i> at its associated low level to turn on an associated PMOS transistor M and to turn off an associated NMOS transistor N in the first push-pull circuit 704(1). In turn, the first push-pull circuit 704(1) is configured to operate with maximum pull-up drive strength to generate and maintain the first ramp signal I2pA at its high level. Additionally, each ith drive strength control signal generator 708(i) is configured to generate its associated second drive strength control signal sel1b<i> at its associated high level to turn on an associated NMOS transistor N and to turn off an associated PMOS transistor M in the second push-pull circuit 704(2). In turn, the second push-pull circuit 704(2) is configured to operate with maximum push-down drive strength to generate and maintain the second ramp signal I2pB at its low level.

Also, during a non-ramp period during which the first ramp signal I2pA is to be at its low level and the second ramp signal I2pB is to be at its high level, each ith drive strength control signal generator 708(i) is configured to generate its associated first drive strength control signal sel1<i> at its associated high level to turn off an associated PMOS transistor M and to turn on an associated NMOS transistor N in the first push-pull circuit 704(1). In turn, the first push-pull circuit 704(1) is configured to operate with maximum push-down drive strength to generate and maintain the first ramp signal I2$p$A at its low level. Additionally, each ith drive strength control signal generator 708($i$) is configured to generate its associated second drive strength control signal sel1$b$<$i$> at its associated low level to turn on an associated PMOS transistor M and to turn off an associated NMOS transistor N in the second push-pull circuit 704(2). In turn, the second push-pull circuit 704(2) is configured to operate with maximum pull-up drive strength to generate and maintain the second ramp signal I2$p$B at its high level.

In addition, during a ramp period during which the first ramp signal I2$p$A is to ramp up and the second ramp signal I2$p$B is to ramp down, for a given ith drive strength control signal generator 708($i$) receiving a given ith delay signal I1$p$A<$i$>, if the given ith delay signal I1$p$A<$i$> is one of the subset of the delay signals I1$p$A<0> to I1$p$A<N> that transitions (either by performing a rising transition or a falling transition) during a time window corresponding to the ramp period as set by the first and third pre-intermediate signals I1$p$A, I1$p$C, the ith drive strength control signal generator 708($i$) is configured to: (1) transition its first drive strength control signal sel1<$i$> from the high level to the low level to turn on an associated PMOS transistor M and turn off an associated NMOS transistor N of the first push-pull circuit 704(1) in order to increase the pull-up drive strength of the first push-pull circuit 704(1), and (2) transition its second drive strength control signal sel1$b$<$i$> from the low level to the high level to turn on an associated NMOS transistor N and turn off an associated PMOS transistor P of the second push-pull circuit 704(2) in order to increase the push-down drive strength of the second push-pull circuit 704(2), in response to the transition of the given ith delay signal I1$p$A<$i$>. Alternatively, if the given ith delay signal I1$p$A<$i$> does not transition during the time window, then the ith drive strength control signal generator 708($i$) is configured to: (1) output its first drive strength control signal sel1<$i$> at the high level to turn off an associated PMOS transistor M and turn on an associated NMOS transistor N of the first push-pull circuit 704(1), and (2) output its second drive strength control signal sel1$b$<$i$> at the low level to turn off an associated NMOS transistor N and turn on an associated PMOS transistor M of the second push-pull circuit 704(2), for the duration of the ramp period. Then, at the end of the ramp period, the ith drive strength control signal generator 708($i$) is configured to: (1) transition its first drive strength control signal sel1<$i$> from the high level to the low level to turn on an associated PMOS transistor M and turn off an associated NMOS transistor N of the first push-pull circuit 704(1), and (2) transition its second drive strength control signal sel1$b$<$i$> from the low level to the high level to turn on an associated NMOS transistor N and turn off an associated PMOS transistor P of the second push-pull circuit 704(2). Such functionality has the effect of causing the first push-pull circuit 704(1) to ramp up the level of the first ramp signal I2$p$A with a linearly increasing drive strength by increasing the number of PMOS transistors M of the first push-pull circuit 704(1) that turn on at a linear rate over the duration of the ramp period, and causing the second push-pull circuit 704(2) to ramp down the level of the second ramp signal I2$p$B with a linearly increasing drive strength by increasing the number of NMOS transistor N of the second push-pull circuit 704(2) that turn on at a linear rate over the duration of the ramp period.

Further, during a ramp period during which the first ramp signal I2$p$A is to ramp down and the second ramp signal I2$p$B is to ramp up, for a given ith drive strength control signal generator 708($i$) receiving a given ith delay signal I1$p$A<$i$>, if the given ith delay signal I1$p$A<$i$> transitions (either by performing a rising transition or a falling transition) during a time window corresponding to the ramp period as set by the first and third pre-intermediate signals I1$p$A, I1$p$C, the ith drive strength control signal generator 708($i$) is configured to: (1) transition its first drive strength control signal sel1<$i$> from the low level to the high level to turn off an associated PMOS transistor M and turn on an associated NMOS transistor N of the first push-pull circuit 704(1) in order to increase the push-down drive strength of the first push-pull circuit 704(1), and (2) transition its second drive strength control signal sel1$b$<$i$> from the high level to the low level to turn off an associated NMOS transistor N and turn on an associated PMOS transistor P of the second push-pull circuit 704(2) in order to increase the pull-up drive strength of the second push-pull circuit 704(2), in response to the transition of the given ith delay signal I1$p$A<$i$>. Alternatively, if the given ith delay signal I1$p$A<$i$> does not transition during the time window, then the ith drive strength control signal generator 708($i$) is configured to: (1) output its first drive strength control signal sel1<$i$> at the low level to turn on an associated PMOS transistor M and turn off an associated NMOS transistor N of the first push-pull circuit 704(1), and (2) output its second drive strength control signal sel1$b$<$i$> at the high level to turn on an associated NMOS transistor N and turn off an associated PMOS transistor M of the second push-pull circuit 704(2), for the duration of the ramp period. Then, at the end of the ramp period, the ith drive strength control signal generator 708($i$) is configured to: (1) transition its first drive strength control signal sel1<$i$> from the low level to the high level to turn off an associated PMOS transistor M and turn on an associated NMOS transistor N of the first push-pull circuit 704(1), and (2) transition its second drive strength control signal sel1$b$<$i$> from the high level to the low level to turn off an associated NMOS transistor N and turn on an associated PMOS transistor P of the second push-pull circuit 704(2). Such functionality has the effect of causing the first push-pull circuit 704(1) to ramp down the level of the first ramp signal I2$p$A with a linearly increasing drive strength by increasing the number of NMOS transistors N of the first push-pull circuit 704(1) that turn on at a linear rate over the duration of the ramp period, and causing the second push-pull circuit 704(2) to ramp up the level of the second ramp signal I2$p$B with a linearly increasing drive strength by increasing the number of PMOS transistor M of the second push-pull circuit 704(2) that turn on at a linear rate over the duration of the ramp period.

For some example configurations, such as that shown in FIG. 7, the first ramp generation sub-circuit 702(1) may further include an AND logic gate 710 and an XNOR logic gate 712, each configured to receive the first pre-intermediate signal I1$p$A and the third pre-intermediate signal I1$p$C. The AND logic gate 710 is configured to perform an AND logic operation on the first and third pre-intermediate signals I1$p$A, I1$p$C to generate a first AND signal AND1. The XNOR logic gate 712 is configured to perform an XNOR logic operation on the first and third pre-intermediate signals I1$p$A, I1$p$C to generate a first XNOR signal XNOR1. For such configurations, in addition to receiving a respective ith delay signal I1$p$A<$i$>, each ith drive strength control signal generator 708($i$) is configured to receive the first AND signal AND1, the first XNOR signal XNOR1, the first pre-intermediate signal I1pA, and the third pre-intermediate signal I1pC. Further details of an example configurations of a drive strength control signal generator is described in further detail below with respect to FIG. 8.

The second ramp-generation sub-circuit 702(2) may be configured similar to that of the first ramp generation sub-circuit 702(1), except that it ramps up and down the third and fourth ramp signals I2pC, I2pD based on time windows established by the third pre-intermediate signal I1pC setting the start times of the time windows and the second pre-intermediate signal I1pB setting the end time of the time windows. As shown in FIG. 7, the second ramp generation sub-circuit 702(2) may include a second delay chain 706(2) including an N-number of delay elements D2(1) to D2(N), each configured to generate an N-number of delay signals I1pC<1> to I1pC<N> based on the third pre-intermediate signal I1pC. The second ramp-generation sub-circuit 702(2) may further include a second drive strength controller that includes an (N+1)-number of drive strength control signal generators 714(0) to 714(N), each configured to generate an ith pair of drive strength control signals sel2<i>, sel2b<i> of a second set of drive strength control signals sel2, sel2b. The drive strength control signal generators 714(0) to 414(N) are configured to output the second set of drive strength control signals sel2, sel2b to control PMOS and NMOS transistors M, N of push-pull sub-circuits of the third and fourth push-pull circuits 704(3), 704(4). The drive strength control signal generators 714 may operate similarly to that of the drive strength control signals generators 708 of the first ramp generation sub-circuit 702(1). Each ith drive strength control signal generator 714(i) may output its first and second drive strength control signals sel2<i>, sel2b<i> at associated high and low levels so that: (1) the third and fourth push-pull circuits 704(3), 704(4) operate with respective maximum pull-up and push-down drive strengths when respectively generating the third and fourth ramp signals I2pC, I2pD at high and low levels; (2) the third and fourth push-pull circuits 703(3), 704(4) operate with respective maximum push-down and pull-up drive strengths when respectively generating the third and fourth ramp signals I2pC, I2pD at low and high levels; (3) the third and fourth push-pull circuits 704(3) operate to increase the number of PMOS transistors M in the third push-pull circuit 704(3) turning on and the number of NMOS transistors N in the fourth push-pull circuit 704(4) turning on at a linear rate during ramp periods to ramp up the third ramp signal I2pC and ramp down the fourth ramp signal I2pD; and (4) the third and fourth push-pull circuits 704(3) operate to increase the number of NMOS transistors N in the third push-pull circuit 704(3) turning on and the number of PMOS transistor M in the fourth push-pull circuit 704(4) turning on at a linear rate during ramp periods to ramp down the third ramp signal I2pC and ramp up the fourth ramp signal P2pD.

In addition, as shown in FIG. 7, the second ramp generation sub-circuit 702(2) may include a first AND logic gate 716 and a second XNOR logic gate 718, each configured to receive the third pre-intermediate signal I1pC and the second pre-intermediate signal I1pB. The second AND logic gate 716 is configured to perform an AND logic operation on the third and second pre-intermediate signals I1pC, I1pB to generate a second AND signal AND2. The second XNOR logic gate 718 is configured to perform an XNOR operation on the third and second pre-intermediate signals I1pC, I1pB to generate a second XNOR signal XNOR2. In addition to receiving an ith delay signal I1pC<i>, each ith drive strength signal generate 714(i) is configured to receive the second AND signal AND2, the second XNOR signal XNOR2, the third pre-intermediate signal I1pC, and the second pre-intermediate signal I1pB.

Figure 8:
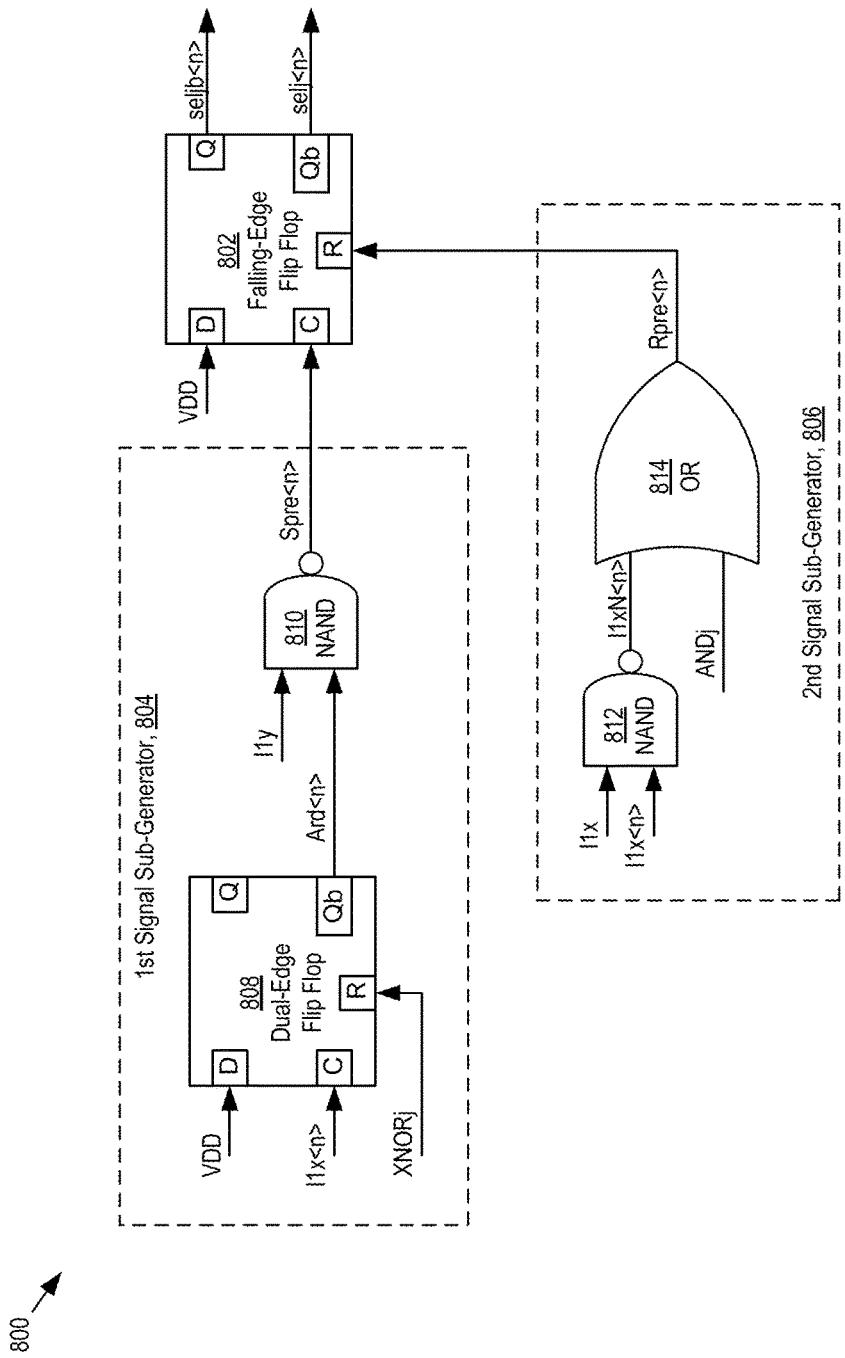
FIG. 8 is a block diagram of an example configuration of a drive strength control signal generator of FIG. 7.

FIG. 8 shows a block diagram of an example drive strength control signal generator 800, which may be representative of an example configuration of any of the drive strength control signal generators 708 of the first ramp generation sub-circuit 702(1) and the drive strength control signal generators 714 of the second ramp generation sub-circuit 702(2). The example drive strength control signal generator 800 includes a falling-edge flip flop 802 configured to generate a pair of drive strength control signals, including a first drive strength control signal selj<n> and a second drive strength control signal seljb<n>, which may be representative of a pair of drive strength control signals that an nth drive strength control signal generator 708(n) or 714(n) of a jth ramp generation sub-circuit 702(j) generates and outputs to an associated pair of push-pull circuits 704. As shown in FIG. 8, the falling-edge flip flop 802 may output the pair of drive strength control signal seljb<n>, selj<n> at its Q and Qb output terminals.

The falling-edge flip flop 802 may further be configured to receive a voltage at a high voltage level (e.g., the high supply voltage level VDD) at its D input, and may further be configured to receive a first internal control signal Spre<n> at its clock input C and a second internal control signal Rpre<n> at its reset input R. The first and second internal control signals Spre<n>, Rpre<n> are representative of nth first and second internal control signals generated in an nth drive strength control signal generator 708(n) or 714(n). In response to falling transitions of the first internal control signal Spre<n> received at its clock input C, the falling-edge flip flop 802 is configured to transition the first drive strength control signal selj<n> output at its Qb output to a low level, and to transition the second drive strength control signal seljb<n> output at its Q output to a high level. In addition, in response to rising transitions of the second internal control signal Rpre<n> receive at its reset input R, the falling-edge flip flop 802 is configured to transition the first drive strength control signal selj<n> output at its Qb output to a low high, and to transition the second drive strength control signal seljb<n> output at its Q output to a low level.

The example drive strength control signal generator 800 may further include a first signal sub-generator 804 configured to generate and output the first internal control signal Spre<n> and a second signal sub-generator 806 configured to generate and output the second internal control signal Rpre<n>.

For a pair of push-pull circuits generating a pair of complementary ramp signals—i.e., the pair of push-pull circuits being either the first and second push-pull circuits 704(1), 704(2) generating the first pair of complementary ramp signals I2pA, I2pB, or the third and fourth push-pull circuits 704(3), 704(4) generating the second pair of complementary ramp signals I2pC, I2pD—the first and second signal sub-generators 804, 806 generate the first and second internal control signals Spre<n>, Rpre<n> to alternatingly control the pull-up and push-down drive strengths of the pair of push-pull circuits. To illustrate, suppose the falling-edge flip flop 802 outputs the first drive strength control signal selj<n> to an nth push-pull sub-circuit in the second push-pull circuit 704(2) and outputs the second drive strength control signal seljb<n> to an nth push-pull sub-circuit in the first push-pull circuit 704(1). The first internal control signal Spre<n> may control the push-down drive strength and the second internal control signal Rpre<n> may control the pull-up drive of the first push-pull circuit 704(1) generating the first ramp signal I1pA. In addition, the first internal control signal Spre<n> may control the pull-up drive strength and the second internal control signal Rpre<n> may control the push-down drive strength of the second push-pull circuit 704(2) generating the second ramp signal I2pA.

As shown in FIG. 8, each of the first and second signal sub-generators 804, 806 is configured to receive an nth delay signal I1x<n>, which is representative of an nth delay signal I1pA<n> that an nth drive strength signal generator 708(n) of the first ramp generation sub-circuit 702(1) may receive or an nth delay signal I1pC<n> that an nth drive strength signal generator 714(n) of the second ramp generation sub-circuit 702(2) may receive. In order to alternatingly control the pull-up and push-down drive strengths of a given pair of push-pull circuits generating a pair of complementary ramp signals, for a given ramp period where a first ramp signal of the pair is ramping up and a second ramp signal of the pair is ramping down, if the nth delay signal I1x<n> transitions in the time window corresponding to the given ramp period, the first signal sub-generator 804 may transition low the first internal control signal Spre<n> in response to the transition of the nth delay signal I1x<n>. In response to the transition low, the falling-edge flip flop 802 will transition low the first drive strength control signal selj<n> to increase the pull-up drive strength of the push-pull circuit ramping up the first ramp signal during the given ramp period, and will transition high the second drive strength control signal seljb<n> to increase the push-down drive strength of the push-pull circuit ramping down the second ramp signal during the given ramp period. However, if the nth delay signal I1x<n> does not transition in the time window, then the first signal sub-generator 804 keeps the first internal control signal Spre<n> at a high level for the duration of the given ramp period, which in turn causes the falling-edge flip flop 802 to not increase the pull-up and push-down drive strengths. Then, at the end of the given ramp period, the first signal sub-generator 804 may transition the first internal control signal Spre<n> to the low level, which in turn causes the falling-edge flip flop 802 to transition low the first drive strength control signal selj<n> to increase the pull-up drive strength of the push-pull circuit that ramped up the first ramp signal, and to transition high the second strength control signal seljb<n> to increase the push-down drive strength of the push-pull circuit that ramped down the second ramp signal. Doing so enables the push-pull circuit generating the first ramp signal to have maximum pull-up drive strength when maintaining the first ramp signal at the high level and the push-pull circuit generating the second ramp signal to have maximum push-down drive strength when maintaining the second ramp signal at the low level during a next ramp period when the other pair of complementary ramp signals ramp up and down.

To function in this manner, the first signal sub-generator 804 may include a dual-edge flip flop 808 and a NAND logic gate 810. The dual-edge flip flop may receive a voltage at a high level, such as the high supply voltage level VDD, at its D input, the nth delay signal I1x<n> at its clock input, and a jth XNOR signal XNORj at its reset input R. The jth XNOR signal XNORj is representative of either the first XNOR signal XNOR1 output by the first XNOR logic gate 712 of the first ramp generation sub-circuit 702(1) or the second XNOR signal XNOR2 output by the second XNOR logic gate 718 of the second ramp generation sub-circuit 702(2). The dual-edge flop may be configured to output an output signal Ard<n> at its Qb output terminal to the NAND logic gate 810. By having a dual-edge configuration, the dual-edge flip flop 808 may transition low its output signal Ard<n> at the Qb output terminal in response to both rising and falling transitions of the delay signal I1x<n> received at the clock input. The XNOR signal XNORj received at the reset input R ensures that the output signal Ard<n> resets back to a high level for a next ramp period that the first signal sub-generator 804 is to control pull-up and push-down drive strengths.

In addition to receiving the output signal Ard<n> from the dual-edge flip flop 808, the NAND logic gate 810 is also configured to receive a pre-intermediate signal I1y, which is representative of the pre-intermediate signal of the combination that sets the end times of the time windows, such as the third pre-intermediate signal I1C received by the first ramp generation sub-circuit 702(1) or the second pre-intermediate signal I2B received by the second ramp generation sub-circuit 702(2). The NAND logic gate is configured to perform a NAND logic operation on the output signal Ard<n> of the dual-edge flip flop 808 and the pre-intermediate signal I1y to generate the first internal control signal Spre<n>.

In a similar manner, in order to alternatingly control the pull-up and push-down drive strengths of a given pair of push-pull circuits generating a pair of complementary ramp signals, for a given ramp period where a first ramp signal of the pair is ramping up and a second ramp signal of the pair is ramping down, if the nth delay signal I1x<n> transitions in the time window corresponding to the given ramp period, the second signal sub-generator 806 may transition high the second internal control signal Rpre<n> in response to the transition of the nth delay signal I1x<n>. In response to the transition high, the falling-edge flip flop 802 will transition low the second drive strength control signal seljb<n> to increase the pull-up drive strength of the push-pull circuit ramping up the first ramp signal during the given ramp period, and will transition high the first drive strength control signal selj<n> to increase the push-down drive strength of the push-pull circuit ramping down the second ramp signal during the given ramp period. However, if the nth delay signal I1x<n> does not transition in the time window, then the second signal sub-generator 806 keeps the first internal control signal Spre<n> at a low level for the duration of the given ramp period, which in turn causes the falling-edge flip flop 802 to not increase the pull-up and push-down drive strengths. Then, at the end of the given ramp period, the second signal sub-generator 806 may transition the second internal control signal Rpre<n> to the high level, which in turn causes the falling-edge flip flop 802 to transition low the second drive strength control signal seljb<n> to increase the pull-up drive strength of the push-pull circuit that ramped up the first ramp signal, and to transition high the first strength control signal selj<n> to increase the push-down drive strength of the push-pull circuit that ramped down the second ramp signal. Doing so enables the push-pull circuit generating the first ramp signal to have maximum pull-up drive strength when maintaining the first ramp signal at the high level and the push-pull circuit generating the second ramp signal to have maximum push-down drive strength when maintaining the second ramp signal at the low level during a next ramp period when the other pair of complementary ramp signals ramp up and down.

To function in this manner, the second signal sub-generator 806 may include a NAND logic gate 812 and an OR logic gate 814. The NAND logic gate 812 is configured to receive the nth delay signal I1x<n> and the pre-intermediate signal I1x of the combination that sets the start times and based on which the nth delay signal I1x<n> is generated. The NAND logic gate 812 is further configured to perform a NAND logic operation on the pre-intermediate signal I1x and the nth delay signal I1x<n> to generate a NAND output signal I1xN<n>, and output the NAND output signal I1xN<n> to the OR logic gate 814. In addition to receiving the NAND output signal I1xN<n>, the OR logic gate 814 may also receive a jth AND signal ANDj, which may be representative of either the first AND signal AND1 output by the first AND logic gate 710 of the first ramp generation sub-circuit 702(1) or the second AND signal AND2 output by the second AND logic gate 716 of the second ramp generation sub-circuit 702(2). The OR logic gate 814 may be configured to perform an OR logic operation on the NAND output signal I1xN<n> and the jth AND signal ANDj to generate the second internal control signal Rpre<n>.

Referring back to FIG. 4, the ramp generation circuit 404 may be configured to output the first and second pairs of complementary ramp signals I2pA, I2pB and I2pC, I2pD to the detection circuit 406. As described, the detection circuit 406 is configured to detect midpoints of the time durations of the time intervals of the input signal IN. To do so, the detection circuit 406 is configured to detect cross-points of the first pair of complementary ramp signals I2pA, I2pB and cross-points of the second pair of complementary ramp signals I2pC, I2pD during their respective ramp periods. In general, for a pair of complementary signals, a cross-point is a point in time when the magnitude levels (e.g., voltage levels or current levels) of the complementary signals are the same. A cross-point typically occurs when a first signal of the pair is performing a rising transition and a second signal of the pair is performing a falling transition. For a given pair of complementary ramp signals—e.g., either the first pair of ramp signals I2pA, I2pB or the second pair of ramp signals I2pC, I2pD—a cross-point occurs during a ramp period when one of the ramp signals is ramping up and the other is ramping down. FIG. 5 identifies the cross-points of the first and second pairs of complementary ramp signals I2pA, I2pB and I2pC, I2pD with "CP" labels.

The detection circuit 406 may be configured to detect the midpoints of the time durations, and in turn measure the average time interval durations of the input signal IN, by detecting the cross-points of the first and second pairs of complementary ramp signals I2pA, I2pB and I2pC, I2pD. Because the magnitudes of the ramp signals linearly increase and decrease during the ramp periods, the cross-points of the ramp signals during the ramp periods may provide a sufficiently close, if not exact, indicator of the midpoints of the time intervals.

In response to detecting the midpoints, such as by detecting the cross-points, the detection circuit 406 may generate and output the set of intermediate signals IA, IB, IC, ID as first and second pairs of complementary signals that transition in response to alternating detected midpoints. The first pair may include the first and third complementary signals IA, IC, and the second pair may include the second and fourth complementary signals IB, ID. For example, as indicated in FIG. 5, in response to detecting a cross-point of the first pair of complementary ramp signals I2pA, I2pB associated with time window TWa, the detection circuit 406 transitions the first pair IA, IC while keeping the second pair IB, ID at respective low and high levels. Then, in response to detecting a cross-point of the second pair of complementary ramp signals I2pC, I2pD associated with a next time window TWb, the detection circuit 406 transitions the second pair IB, ID while keeping the first pair IA, IC at respective high and low levels. The detection circuit 406 may proceed in this manner as further cycles of the ramp signals I2p are generated.

The detection circuit 406 may have any of various circuit configurations in order to detect the cross-points of the pairs of complementary ramp signals I2pA, I2pB and I2pC, I2pD. Some example configurations may utilize a pair of differential amplifiers with a differential input and a differential output. One differential amplifier may receive the first pair of complementary ramp signals I2pA, I2pB and generate the first pair of complementary intermediate signals IA, IC in response to receipt of the first pair of complementary ramp signals I2pA, I2pB, and another differential amplifier may receive the second pair of complementary ramp signals I2pC, I2pD and generate the second pair of complementary intermediate signals IB, ID in response to receipt of the second pair of complementary ramp signals I2pC, I2pD.

Referring to FIG. 1, the output circuit 104 may be configured to receive the intermediate signals I from the measurement circuit 102, such as from the detection circuit 406. In addition, the output circuit 104 may be configured to generate the output signal OUT to transition in response to the transitions of the intermediate signals I indicating the detected midpoints.

Figure 9:
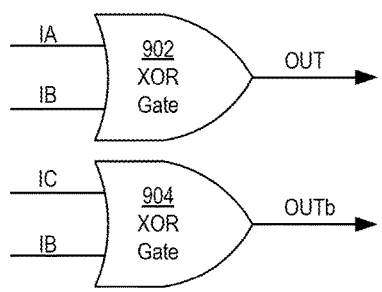
FIG. 9 is a block diagram of an example configuration of the output circuit of FIG. 1.

FIG. 9 is a block diagram of an example configuration of the output circuit 104. As shown in FIG. 9, the example configuration may include an XOR logic gate 902 that is configured to receive one of the intermediate signals from the first pair IA, IC and one of the intermediate signals from the second pair IB, ID. For example, as shown in FIG. 9, the XOR logic gate 902 is configured to receive the first intermediate signal IA from the first pair and the second intermediate signal IB from the second pair. The XOR logic gate 902 is configured to perform an XOR logic operation on the first and second intermediate signals IA, D3 in order to generate the output signal OUT. For example configurations where the duty cycle correction system 100 is configured to generate a pair of complementary output signals OUT, OUTb, the output circuit 104 may further include a second XOR logic gate 904 that is configured to receive the other of the intermediate signals of the first pair—e.g., the third intermediate signal IC as shown in FIG. 9—and the second intermediate signal D3. The second XOR logic gate 904 is configured to perform an XOR logic operation on the second and third intermediate signals IB, IC to generate the second output signal OUTb of the pair of complementary output signals.

For configurations of the duty cycle correction system 100 that generate only a single output signal OUT by way of an XOR logic circuit, the measurement circuit 102, such as via the detection circuit, may generate only two intermediate signals, such as only the first and second intermediate signals IA, IB, as an example. Various ways of generating the intermediate signals I to transition in response to detected midpoints in order to generate a single-ended output signal or a pair of complementary output signals by way of XOR logic circuitry may be possible.

However, using XOR logic circuits to generate the output signal OUT may be undesirable in at least some embodiments since the XOR logic circuits operate on both rising edges and falling edges of the intermediate signals. Some intermediate signals generated by the measurement circuit 104 may have a rise and fall mismatch—i.e., the intermediate signals take different amounts of time to perform rising and falling transitions—which may especially be the case at higher frequencies. To avoid the mismatch, it may be more desirable to generate the output signal OUT (or a pair of complementary output signals OUT, OUTb) in based on only one transition type of the intermediate signals—i.e., based on only the rising edges or on only the falling edges of the intermediate signals I.

Figure 10:
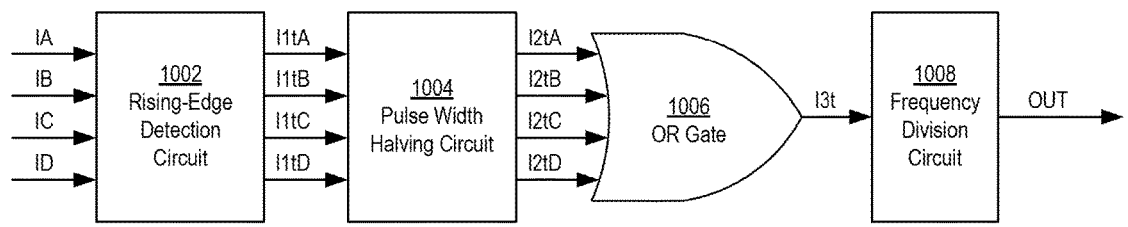
FIG. 10 is a block diagram of another example configuration of the output circuit of FIG. 1.

FIG. 10 shows a block diagram of another example configuration of the output circuit 104 that is configured to generate the output signal OUT based on only rising transitions of the intermediate signals. In the example configuration of FIG. 10, the output circuit 104 includes a rising-edge detection circuit 1002, a pulse width halving circuit 1004, an OR gate logic circuit 1006, and a frequency division circuit 1008. The rising-edge detection circuit 1002 is configured to receive the intermediate signals I and generate a first set of post-intermediate signals I1t in response to receipt of the intermediate signals I. The pulse-width halving circuit 1004 is configured to receive the first set of post-intermediate signals I1t and generate a second set of post-intermediate signal I2t in response to receipt of the first set of post-intermediate signals I1t. The OR logic gate 1006 is configured to receive the second set of post-intermediate signals I1t and generate a third post-intermediate signal I3t in response to receipt of the second set of post-intermediate signals I2t.

Figure 11:
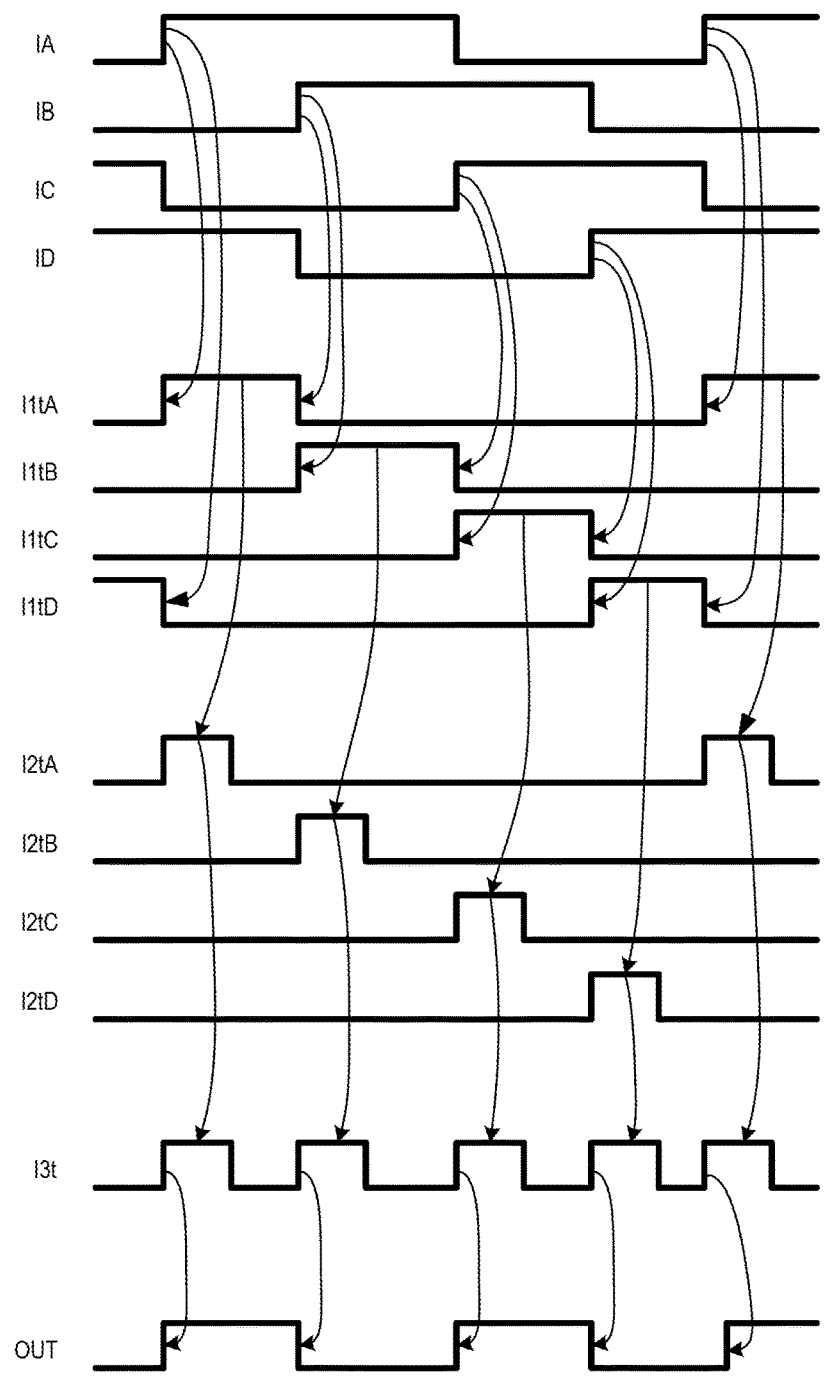
FIG. 11 is a timing diagram of example signals generated with the circuit components of the example configuration of FIG. 10.

FIG. 11 shows a timing diagram of example waveforms of the post-intermediate signals I1t, I2t, and I3t that they circuit components of FIG. 10 may generate in response to receipt of the intermediate signals I from the measurement circuit 102 in order to generate the output signal OUT. As shown in FIG. 11, the rising-edge detection circuit 1002 may be configured to generate each of the post-intermediate signals to perform rising and falling transitions in response to rising transitions (and not falling transitions) of a different one of a plurality of combinations of two signals from the first and second pairs of intermediate signals IA, IC and IB, ID. For example, the rising edge detection circuit 1002 may be configured to generate a first post-intermediate signal I1tA to perform rising and falling transitions in response to only rising transitions of the first and second intermediate signals IA, IB. In addition, the rising edge detection circuit 1002 may be configured to generate a second post-intermediate signal I1tB to perform rising and falling transitions in response to only rising transitions of the second and third intermediate signals IB, IC. Also, the rising edge detection circuit 1002 may be configured to generate a third post-intermediate signal I1tC to perform rising and falling transitions in response to only rising transitions of the third and fourth intermediate signals IC, ID. Additionally, the rising edge detection circuit 1002 may be configured to generate a fourth post-intermediate signal I1tD to perform rising and falling transitions in response to only rising transitions of the first and fourth intermediate signals IA, ID.

The rising-edge detection circuit 1002 may have any of various circuit topologies to generate the first set of post-intermediate signals I1t based on the rising transitions of the different combinations of intermediate signals I. In one example configuration, the rising-edge detection circuit 1002 includes four sub-circuits, with each sub-circuit including a pair of inverter circuits configured to receive two intermediate signals and provide a pair of outputs to a pair of cross-coupled NAND gate circuits. Each of the cross-coupled NAND gate circuits, in turn, may output one of the post-intermediate signals I1t of the first set. Other circuit configurations may be possible.

The pulse width halving circuit 1004 may be configured to reduce the pulse width of the pulses of the first set of post-intermediate signals I1t, such as by cutting the pulse width of the pulses in half, to generate the second set of post-intermediate signals I2t. For example, as shown in FIG. 11, the pulse width halving circuit 1004 is configured to halve the pulse widths of the pulses of the first post-intermediate signal I1tA of the first set to generate a first post-intermediate signal I2tA of the second set, halve the pulse widths of the pulses of the second post-intermediate signal I1tB of the first set to generate a second post-intermediate signal I2tB of the second set, halve the pulse widths of the pulses of the third post-intermediate signal I1tC to generate a third post-intermediate signal I2tC of the second set, and halve the pulse widths of the pulses of the fourth post-intermediate signal I1tD of the first set to generate a fourth post-intermediate signal I2tD of the second set.

The pulse width halving circuit 1004 may have any of various circuit topologies to reduce or halve the pulses widths of the pulses of the first set of post-intermediate signals I2t. In one example configuration, the pulse width halving circuit 1004 includes four sub-circuits, with each including an AND gate having a first input configured to receive one of post-intermediate signals I2t of the first set, and a delay chain that receives the one of the post-intermediate signals I2t of the first set, and outputs an output signal to a second input of the AND gate. The second set of post-intermediate signals I2t are the output signals of the AND logic gates of the sub-circuits. Various other types of circuit topologies for the pulse width halving circuit 1004 may be possible.

The OR logic gate 1006 is configured to receive the second set of post-intermediate signals I2t from the pulse width halving circuit 1004, and perform an OR logic operation on the second set of post-intermediate signals I2t to generate the third post-intermediate signal I3t. As a result of the OR logic operation, the OR logic gate 1006 is configured to combine the pulses of the second set of post-intermediate signals I2t in order to generate the third post-intermediate signal I3t. In this context, the OR logic gate 1006 generates the third post-intermediate signal I3t as a combined signal I3t that is a combination of the pulses of the second set of post-intermediate signals I2t. The effect of generating the first and second sets of post-intermediate signals I1t, I2t and then combining the pulses of the second set of post-intermediate signals I2t is that the pulses of the third post-intermediate signal I3t perform rising transitions in response to the detected midpoints indicated by the intermediate signals I.

The frequency division circuit 1008 is configured to generate the output signal OUT to perform rising and falling transitions in response to rising transitions (and not falling transitions) of the combined signal I3t. Any of various circuit topologies for the frequency division circuit 1008 may be possible. In one example configuration, the frequency division circuit 1008 includes a D flip flop that has its Qb output coupled to its D input, and receives the combined signal I3t from the OR logic gate 1006 at its clock input. Various other circuit topologies may be possible.

Using the circuit configuration of FIG. 10, the output circuit 104 is configured to transition the output signal OUT in response to detected midpoints of the time intervals of the input signal IN based on only one type of transitions (e.g., only on rising transitions) indicating of the intermediate signals I indicating the detected midpoints. Other circuit configurations may be possible. For example, rather that respond to only rising transitions, an alternative circuit configuration may instead respond to only falling transitions. The rising-edge detection circuit 1002 may instead be configured as a falling-edge detection circuit that detects falling edges and not rising edges of the intermediate signals I to generate the first set of post-intermediate signals I1*t*. In addition or alternatively, the frequency division circuit 1008 may be configured to generate the output signal OUT to perform rising and falling transitions in response to falling transitions and not rising transitions of the third post-intermediate signal I3*t*.

Figure 12:
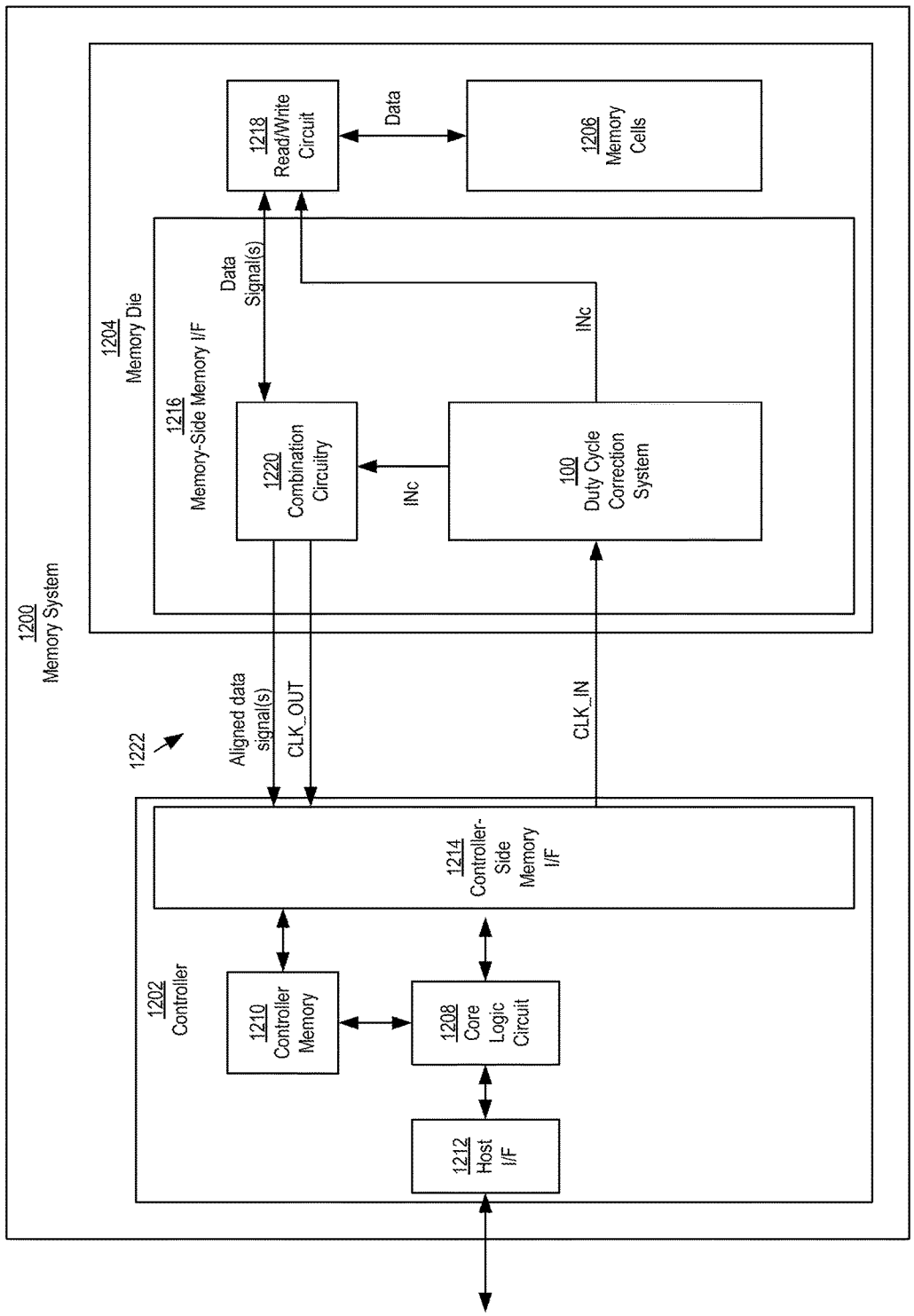
FIG. 12 is a block diagram of an example memory system in which the duty cycle correction system of FIG. 1 may be implemented.

FIG. 12 shows a block diagram of an example memory system 1200 that may include the duty cycle correction system 100 to perform duty cycle correction on an input clock signal CLK_IN. The memory system 1200 may be configured to be connected to and/or in communication with a host system (not shown). The host system may be any electronic system or device that is configured to communicate and/or operate with the memory system 1200.

The memory system 1200 may include a controller 1202 and a memory die 1204. The memory die 1204 may include memory cells or elements 1206, with each memory cell or element being configured to store one or more bits of data. Any suitable type of memory cells can be used. As examples, the memory cells may be volatile memory such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory cells can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

The controller 1202 may include a core logic circuit 1208. The core logic circuit 1208 may be configured to perform memory management functions, non-limiting examples of which may include, but not limited to, communicating with the host system, including receiving, handling, and responding to host requests or commands, such as read, write, erase, and status requests/commands received from the host system; error detection and correction (which may be part of handling host requests/commands); formatting the memory cells 1206 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 1206); and transitioning the memory system 1200 between different states, operation modes, and/or power consumption modes. In operation, when the host system needs to read data from or write data to the memory 1206, it may communicate with the core logic circuit 1208. The core logic circuit 1208 may include hardware or a combination of hardware and software. For example, the core logic circuit 1208 may include a central processing unit, an application specific integrated circuit (ASIC), a field programmable gate array (FPGA), a digital logic circuit, an analog circuit, a combination of discrete circuits, gates, or any other type of hardware, or a combination thereof.

The controller 1202 may also include controller memory 1210, which may include volatile memory (e.g., random access memory (RAM)), non-volatile memory (e.g., read-only memory (ROM)), or a combination thereof. The controller memory 1210 may store software or firmware instructions and/or certain data structures, such as address translation data structures, that the core logic circuit 1208 may access and/or and execute to perform at least some of its memory management functions. Additionally, the core logic circuit 1208 may temporarily store data that is to be transferred to and stored in the memory cells 1206 such as in response to a host write command, and/or that was retrieved from the memory cells 1206 and is to be sent to the host system, such as in response to a host read command. FIG. 12 shows the controller memory 1210 as a component of the controller 1202, although in other example configurations, at least some of the controller memory 1210 may be a component of the memory system 1200 that is separate from the controller 1202. For example, the controller 1202 may be an integrated circuit, and depending on the configuration of the memory system 1200, the controller memory 1210 may be located on the integrated circuit, partially on the integrated circuit and partially separate from the integrated, or completely separate from the integrated circuit.

The controller 1202 may further include a host interface (I/F) 1212. The core logic circuit 1208 may be configured to communicate with a host system via a host interface 1212. In addition, the controller 1202 may include a controller-side memory interface (I/F) 1214 through which the controller 1202 is configured to communicate with the memory die 1204. Similarly, the memory die 1204 may include a memory-side memory interface (I/F) 1216 through which the memory die 1204 is configured to communicate with the controller 1202.

As shown in FIG. 12, the memory-side memory interface 1216 may include the duty correction system 100 of FIG. 1 and have any of the various circuit configurations and/or generate any of the various signals as described with reference to FIGS. 2-11. When the controller 1202 wants to read data stored in the memory cells 1206, such as in response to receipt of a host read request from the host system, a read/write circuit 1218 may be configured to retrieve the data from the memory cells 1206 and output the data as one or more data signals to combination circuitry 1220 in the memory-side memory interface 1216. In order for the controller 1202 to know when to latch on to or sample the data pulses of the data signal(s), the controller 1202 may send a clock signal CLK_IN (which may be either a single-ended clock signal or a pair of complementary clock signals) to the memory die 1204 so that the memory die 1204 can have a clock signal with which to align the data pulses of the data signals. The memory die 1204 may then send the data aligned data signal(s) along with a clock signal CLK_OUT (which may be either a single-ended signal clock signal or a pair of complementary clock signals) back to the controller 1202, and the controller 1202 may look to the rising and/or falling edges of the clock signal CLK_OUT it receives to determine when to latch onto, sample, or otherwise identify the levels of the data pulses.

In a particular example configuration, when the controller 1202 wants to read data from the memory cells 1206, the controller-side memory interface 1214 may output the clock signal CLK_IN on a clock line (or a pair of clock lines) of a communications bus 1222 to the memory-side memory interface 1216. Ideally, the memory-side interface 1216 receives the clock signal CLK_IN with all of the instantaneous duty cycles matched to the target 50% duty cycle. However, in actual implementation, the memory-side interface 1216 will receive the clock signal CLK_IN with some amount of duty cycle distortion, which in turn can lead to errors in aligning the data signal(s) for sending to the controller 1202.

As shown in FIG. 12, the duty cycle correction system 100 may be configured to receive the clock signal CLK_IN from the controller 1202 and perform duty cycle correction on the clock signal CLK_IN, such as by averaging time durations of consecutive time intervals of the clock signal CLK_IN. Through performance of the duty cycle correction, the duty cycle correction system 100 may output a corrected clock signal INc to the combination circuitry 1220, which the combination circuitry 1220 may use for alignment of the data pulses and output of aligned data signals and the output clock signal CLK_OUT to the controller 1202.

In another example configuration, when the controller 1202 wants the memory die 1204 to program data into the memory cells 1206, the controller-side memory interface 1214 may send the input clock signal CLK_IN along with one or more data signals (not shown in FIG. 12) carrying the data that the controller 1202 wants programmed. The duty cycle correction system 100 may receive the clock signal CLK_IN and perform duty cycle correction to generate a corrected clock signal INc. The duty cycle correction system 100 may send the corrected clock signal INc, along with the data signals (not shown in FIG. 12), to the read/write circuit 1218. In response, the read/write circuit 1218 may use the corrected clock signal INc to identify the logic levels of the data pulses of the data signal(s) in order to program the data into the memory cells 1206.

As a component of the memory die 1204, the duty cycle correction system 100 may perform duty cycle correction on-the-fly during a read operation or a write operation. For a read operation, the duty cycle correction system 100 may perform duty cycle correction on-the-fly in that the duty cycle correction system 100 averages the time durations of the clock pulses of the input clock signal CLK_IN that the controller 1202 sends to the memory die 1204 for the memory die 1204 to use to generate the clock pulses of the output clock signal CLK_OUT and the data pulses of the aligned data signals. For a write operation, the duty cycle correction system 100 may perform duty cycle correction on-the-fly in that the duty cycle correction system 100 averages the time durations of the clock pulses of the input clock signal CLK_IN that the controller 1202 sends to the memory die 1204 for the memory die 1204 to use to sample the data pulses of the data signals carrying the data that the controller 1202 wants the memory die 1204 to program into the memory cells 1206.

The duty cycle correction system 100 may perform duty cycle correction on-the-fly instead of as part of a calibration process that occurs ahead or in advance of a read operation or a write operation. Memory dies that perform duty cycle correction ahead of read or write operations may include duty cycle calibration circuitry that can be trained or calibrated into an optimal state during a calibration process. The calibration process may be performed ahead or in advance of a read or a write operation, where the controller 1202 sends a training clock signal or dummy clock pulses before sending clock pulses of the input clock signal CLK_IN. The duty cycle calibration circuitry may use the clock pulses of the training clock signal or the dummy clock pulses to configure itself into the optimal state. After the calibration process, the controller 1202 may then send the clock pulses of the input clock signal CLK_IN that the memory die 1204 uses to perform the read or write operation. Instead of performing duty cycle correction as a calibration process ahead of a read or write operation, the memory die 1204 in FIG. 12, through use of the duty cycle correction system 100, performs duty cycle correction on-the-fly as part of the read or write operation, thus avoiding the need to perform duty cycle correction ahead of time, resulting in more efficient read and write operations.

In general, one challenge for performing duty cycle correction without the use of a training clock signal or dummy clock pulses as part of a calibration process is to address the negative impact of jitter in addition to correcting the duty cycle distortion in the input clock signal CLK_IN. The duty cycle correction system 100 does so through its averaging of time durations of consecutive clock pulses, which not only corrects for duty cycle but also averages out the jitter impact on a pulse-to-pulses basis. That is, the duty cycle correction system 100 will increase the pulse width of the smaller pulses for any two consecutive pulses, irrespective of the magnitude or degree of the pulses widths of the two consecutive pulses. In this regard, the duty cycle correction system 100 reacts in the same way irrespective of the amount of jitter or the amount of instantaneous duty cycle distortion that any two consecutive clock pulses of the input clock signal CLK_IN may have.

Other ways to configure the duty cycle correction system 100 in the memory system 1200, and used in conjunction with a read operation or a write operation, may be possible. For example, the duty cycle correction system 100 (or a second duty cycle correction system) may be positioned at the output of the combination circuitry 1220. This way, should there be duty cycle distortion in the output clock signal generated by the combination circuitry 1220, the duty cycle correction system 100 will correct for the distortion prior to memory-side memory interface 1216 outputting an output clock signal CLK_OUT to the controller 1202. In addition or alternatively, the controller 1202 may be configured with the duty cycle correction system 100. For example, the controller-side memory interface 1214 may be configured with a duty cycle correction system 100 that performs duty cycle correction on the CLK_OUT before latching or sampling any levels of the data pulses of the aligned data signal(s) received from the memory die 1204. In addition or alternatively, the controller-side memory interface 1214 may include a duty cycle correction system 100 that performs duty cycle correction on the clock signal CLK_IN before the controller-side memory interface 1214 outputs the clock signal CLK_IN to the memory die 1204.

Figure 13:
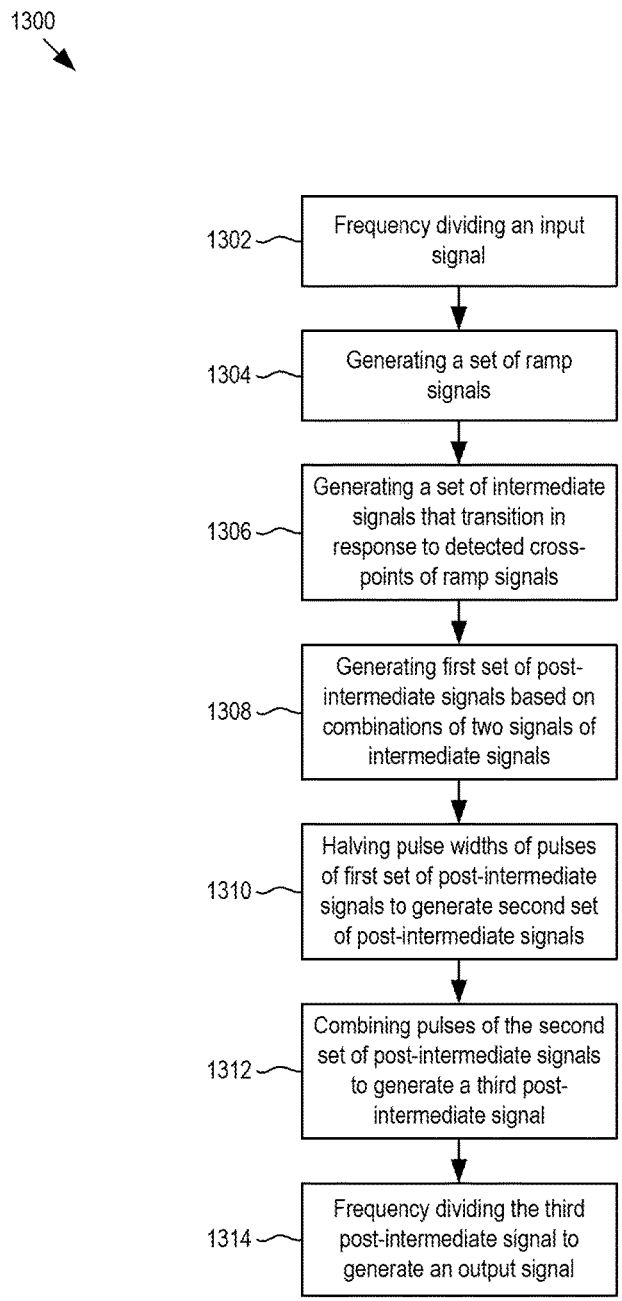
FIG. 13 is an example method of generating an output signal based on an input signal.

FIG. 13 shows a flow chart of an example method 1300 of generating an output signal based on an input signal. In some example embodiments of the method 1300, the actions are performed with the various circuits and sub-circuits as described with reference to FIGS. 1-12. Other example embodiments of the method 1300 may be performed with other components. For example, the actions are performed with a processor executing computer instructions stored in a non-transitory computer readable medium, control logic, or the like.

At block 1302, a frequency division circuit, such as the frequency division circuit 402 of FIG. 4, frequency divides an input signal to generate a first set of pre-intermediate signals, such as the first set of pre-intermediate signals I1$p$ of FIG. 5. At block 1304, a ramp generation circuit, such as the ramp generation circuit 404, generates a second set of pre-intermediate signals, such as the second set of pre-intermediate signals Ip2 of FIG. 5, that transition over ramp periods corresponding to time windows established by the first set of pre-intermediate signals. At block 1306, a detection circuit, such as the detection circuit 406 of FIG. 4, generates a set of intermediate signals, such as the set of intermediate signals I of FIGS. 3 and 5, that transition in response to detected cross-points of the second set of pre-intermediate signals. At block 1308, an edge-detection circuit, such as the rising-edge detection circuit 1002 of FIG. 10, generates a first set of post-intermediate signals, such as the first set of post-intermediate signals I1$t$ of FIG. 11, based on combinations of two signals of the set of intermediate signals. At block 1310, a pulse width halving circuit, such as the pulse width halving circuit 1004, halves pulse widths of pulses of the first set of post intermediate signals to generate a second set of post-intermediate signals, such as the second set of post-intermediate signals I2$t$ of FIG. 11. At block 1312, a combining circuit, such as the OR logic gate circuit 1106, combines pulses of the second set of post-intermediate signals to generate a third post-intermediate signal, such as the third post-intermediate signal I3$t$. At block 1312, a frequency division circuit, such as the frequency division circuit 1008, frequency divides the third post-intermediate signal to generate an output signal, such as the output signal OUT of FIGS. 2 and 11.

Other example method may include more or fewer actions than those described with reference to the flow chart in FIG. 13. Additional actions may include the particular actions that circuit components of the ramp generation circuit, such as those described with reference to FIGS. 7 and/or 8, perform in order to dynamically generate the ramp signals in response to varying time durations of the time intervals of the input signal IN. In addition or alternatively, although the method 1300 is described as being performed by the circuit components described with reference to FIG. 1-12, other example implementations of the method 1300 may use other or different types of circuits or electronic devices. For example, in some implementations, the actions in the example method 1300 may be performed with a processor executing computer instructions stored in a non-transitory computer readable medium, control logic, or the like. Various ways of implementing the one or more of the blocks of the method 1300 through electronic circuitry may be possible.

A means for generating pairs of complementary ramp signals that ramp up and ramp down over ramp periods corresponding to time durations of time intervals of an input signal, in various embodiments, may include ramp detection circuit 404, ramp detection sub-circuits 702(1), 702(2), or the like. Other embodiments may include similar or equivalent means for generating the pair of complementary ramp signals.

A means for detecting cross-points of the pairs of complementary ramp signals, in various embodiments, may include detection circuit 406, differential amplifiers, or the like. Other embodiments may include similar or equivalent means for detecting the cross-points.

A means for generating an output signal that performs rising and falling transitions in response to the detected cross-points may include an output circuit that includes the XOR logic gate circuit 902 or an output circuit that includes a rising-edge detection circuit 1002, a pulse width halving circuit 1004, an OR gate logic circuit 10065, and a frequency division circuit 1008, or the like. Other embodiments may include similar or equivalent means for generating the output signal.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a measurement circuit configured to:
      receive an input signal comprising a plurality of transitions, each transition being a rising transition or a falling transition; and
      measure an average time interval duration of a pair of consecutive time intervals of the input signal, each time interval defined by a pair of consecutively occurring transitions of the input signal; and
   an output circuit configured to generate an output signal comprising a time interval having a duration set to the average time interval duration.

2. The circuit of claim 1, wherein the measurement circuit comprises a detection circuit configured to:
   detect a first midpoint of a first time interval of the pair of consecutive time intervals; and
   detect a second midpoint of a second time interval following the first midpoint of the first time interval of the pair of consecutive time intervals in order to measure the average time interval duration.

3. The circuit of claim 1, wherein the measurement circuit comprises:
   a ramp generation circuit configured to:
      generate a first pair of complementary ramp signals that perform first transitions over a first ramp period corresponding to the first interval of the pair of consecutive time intervals; and
      generate second pair of complementary ramp signals that perform second transitions over a second time interval of the pair of consecutive time intervals; and
   a detection circuit configured to:
      detect a first cross-point of the first transitions and a second cross-point of the second transitions in order to measure the average time interval duration.

4. The circuit of claim 3, wherein the measurement circuit further comprises:
   a frequency division circuit configured to generate a first signal based on rising edges of the input signal and a second signal based on falling edges of the input signal;
   wherein the ramp generation circuit comprises:
      a push-pull circuit configured to generate one of the first pair of complementary ramp signals;
      a delay chain configured to generate a plurality of delay signals based on the first signal; and
      a drive strength controller configured to continuously increase a drive strength of the push-pull circuit based on a subset of delay signals of the plurality of delay signals that transition in a time window set by the first signal and the second signal.

5. The circuit of claim 4, wherein the push-pull circuit comprises a first push-pull circuit, the drive strength comprising a first drive strength, and the ramp generation circuit comprising a second push-pull circuit configured to generate the other of the first pair of complementary ramp signals,
   wherein the drive strength controller is further configured to continuously increase a drive strength of the second push-pull circuit based on the subset of delay signals of the plurality of delay signals that transition in the time window.

6. The circuit of claim 4, wherein the drive strength controller comprises:
   a drive strength control signal generator configured to:
      receive a delay signal of the subset of delay signals transitioning in the time window; and
      transition a level of a drive strength control signal in response to transitioning the delay signal in order to increase the drive strength of the push-pull circuit.

7. The circuit of claim 6, wherein the drive strength control signal generator comprises:
   a first signal sub-generator configured to generate a first internal control signal to control one of a pull-up drive strength or a push-down drive strength of the push-pull circuit; and
   a second signal sub-generator configured to generate a second internal control signal to control the other of the pull-up drive strength or the push-down drive strength of the push-pull circuit.

8. The circuit of claim 7, wherein the ramp generation circuit further comprises:
   an XNOR gate configured perform an XNOR logic operation on the first signal and the second signal to generate an XNOR signal;
   an AND gate configured to perform an AND logic operation on the first signal and the second signal to generate an AND signal,
   wherein the first signal sub-generator comprises:
      a dual edge flip flop configured to receive the delay signal and the XNOR signal; and
      a first NAND gate configured to perform a NAND logic operation on an output of the dual-edge flip and the second signal to generate the first internal control signal, and wherein the second signal sub-generator comprises:
a second NAND gate configured to perform a NAND operation on the first signal and the delay signal; and
an OR gate configured to perform an OR operation on an output of the second NAND gate and the AND signal to generate the second internal control signal.

9. The circuit of claim 4, wherein the drive strength controller comprises a plurality of drive strength signal generators configured to output a plurality of signals to control the drive strength of the push-pull circuit, wherein each drive strength signal generator is configured to:
receive a respective one of the plurality of delay signals; and
output a respective one of the plurality of controls signals to increase the drive strength of the push-pull circuit in response to the respective one of the plurality of delay signals transitioning in the time window.

10. The circuit of claim 9, wherein over a plurality of time windows set by the first signal and the second signal, the drive strength controller is configured to change a number of the plurality of drive strength signal generators that increase the drive strength of the push-pull circuit during ramp periods corresponding to the plurality of time windows.

11. The circuit of claim 1, wherein the input circuit comprises a plurality of time intervals forming a plurality of pairs of consecutive time intervals such that two consecutive pairs comprise a common interval, and wherein the measurement circuit is further configured to measure a plurality of average time interval durations for the plurality of pairs of consecutive time intervals.

12. A circuit comprising:
a detection circuit configured to detect midpoints of a plurality of time intervals of an input signal comprising a plurality of transitions, each transition being a rising transition or a falling transition, each time interval defined by a pair of consecutively occurring transitions of the input signal, the input signal comprising a plurality of cycles, each cycle of the plurality of cycles comprising two time intervals of the plurality of time intervals; and
an output circuit configured to set durations of consecutive time intervals of an output signal according to the detected midpoints of the plurality of time intervals of the input signal.

13. The circuit of claim 12, wherein the output circuit is further configured to:
generate an intermediate signal that performs rising transitions in response to the detected midpoints; and
generate the output signal in response to the rising transitions and not the falling transitions of the intermediate signal.

14. The circuit of claim 12, wherein the plurality of time intervals comprises a plurality of consecutive time intervals, the detection circuit configured to detect midpoints of the plurality of consecutive time intervals.

15. The circuit of claim 12, wherein the detection circuit is configured to:
generate a first pair of complementary signals and a second pair of complementary signals in response to the detected midpoints of the plurality of time intervals, wherein the first pair and the second pair of complementary signals perform respective transitions in response to alternating detected midpoints.

16. The circuit of claim 15, wherein the output circuit is configured to:

receive the first pair and the second pair of complementary signals; and
generate a set of signals, each signal of the set configured to perform respective rising and falling transitions in response to rising transitions of a different one of a plurality of combinations of two signals from the first pair and the second pair of complementary signals.

17. The circuit of claim 16, wherein the set of signals comprises a first set of signals, and wherein the output circuit is further configured to halve pulse widths of the signals of the first set to generate a second set of signals.

18. The circuit of claim 17, wherein the output circuit is further configured:
combine pulses of the second set of signals to generate a combined signal; and
generate the output signal to perform rising and falling transitions in response to rising transitions and not falling transitions of the combined signal.

19. A system comprising:
an input circuit configured to receive a pair of complementary input signals comprising a first input signal and a second input signal;
a ramp generation circuit configured to:
generate a first pair of complementary ramp signals that transition over time durations corresponding to pulse durations of pulses of the first input signal; and
generate a second pair of complementary ramp signals that transition over time durations corresponding to pulse durations of pulses of the second input signal;
a cross-point detection circuit configured to detect a plurality of consecutive cross-points of the first and second pairs of complementary ramp signals; and
an output circuit configured to set durations of consecutive intervals of an output signal in response to detection of the plurality of consecutive cross-points of the first and second pairs of complementary ramp signals.

20. The system of claim 19, further comprising:
a frequency division circuit configured to generate first and second pairs of complementary signals based on alternating rising and falling transitions of the input signal,
wherein the ramp generation circuit comprises a push-pull circuit configured to linearly increase drive strengths over the durations corresponding to the pulse durations of the pulses of the first and second input signals in order to generate the first and second pairs of complementary ramp signals.

21. A circuit comprising:
means for generating pairs of complementary ramp signals that ramp up and ramp down over ramp periods corresponding to time durations of time intervals of an input signal, the pairs of complementary ramp signals comprising:
a first pair of complementary ramp signals that ramp up and ramp down for durations corresponding to durations of a first set of the time intervals during which the input signal is at an associated high level; and
a second pair of complementary ramp signals that ramp up and ramp down for durations corresponding to durations of a second set of the time intervals during which the input signal is at an associated low level;
means for detecting cross-points of the pairs of complementary ramp signals; and
means for generating an output signal that performs rising and falling transitions in response to the detected cross-points.

22. A method comprising:
frequency dividing an input signal to generate a first set of pre-intermediate signals;
generating a second set of pre-intermediate signals that transition over ramp periods corresponding to time windows established by the first set of pre-intermediate signals;
generating a set of intermediate signals that transition in response to detected cross-points of the second set of pre-intermediate signals;
generating a first set of post-intermediate signals based on combinations of two signals of the set of intermediate signals;
halving pulse widths of pulses of the first set of post-intermediate signals to generate a second set of post-intermediate signals;
combining pulses of the second set of post-intermediate signals to generate a third post-intermediate signal; and
frequency dividing the third post-intermediate signal to generate an output signal.

* * * * *